(12) United States Patent
Liu et al.

(10) Patent No.: US 11,574,878 B2
(45) Date of Patent: *Feb. 7, 2023

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Tzuan-Horng Liu, Taoyuan County (TW); Hsien-Wei Chen, Hsinchu (TW); Ming-Fa Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 25 days.

This patent is subject to a terminal disclaimer.

(21) Appl. No.: 17/217,919

(22) Filed: Mar. 30, 2021

(65) Prior Publication Data

US 2021/0217710 A1  Jul. 15, 2021

Related U.S. Application Data

(63) Continuation of application No. 16/717,329, filed on Dec. 17, 2019, now Pat. No. 10,978,410, which is a
(Continued)

(51) Int. Cl.
*H01L 23/58* (2006.01)
*H01L 21/48* (2006.01)
(Continued)

(52) U.S. Cl.
CPC ........ *H01L 23/585* (2013.01); *H01L 21/4853* (2013.01); *H01L 21/563* (2013.01); *H01L 23/31* (2013.01); *H01L 23/49838* (2013.01); *H01L 23/562* (2013.01); *H01L 23/3128* (2013.01); *H01L 23/49811* (2013.01);
(Continued)

(58) Field of Classification Search
CPC . H01L 23/585; H01L 23/31; H01L 23/49838; H01L 23/562; H01L 23/49811; H01L 23/49816; H01L 23/49827; H01L 21/4853; H01L 21/563; H01L 24/13; H01L 24/81; H01L 25/0657; H01L 25/0655;
(Continued)

(56) References Cited

U.S. PATENT DOCUMENTS 9,852,998 B2 * 12/2017 Chen ................. H01L 23/49527
10,510,691 B2 * 12/2019 Liu ....................... H01L 23/562
(Continued)

*Primary Examiner* — Dao H Nguyen
(74) *Attorney, Agent, or Firm* — WPAT Law; Anthony King

(57) ABSTRACT

A semiconductor structure includes a first substrate; a second substrate, disposed over the first substrate; a die, disposed over the second substrate; a via, extending through the second substrate and electrically connecting to the die; a redistribution layer (RDL) disposed between the first substrate and the second substrate, including a dielectric layer, a first conductive structure electrically connecting to the via, and a second conductive structure laterally surrounding the first conductive structure; and an underfill material, partially surrounding the RDL, wherein one end of the second conductive structure exposed through the dielectric layer is entirely in contact with the underfill material.

20 Claims, 17 Drawing Sheets

Related U.S. Application Data continuation of application No. 15/676,375, filed on Aug. 14, 2017, now Pat. No. 10,510,691.

(51) Int. Cl.

| | | |
|---|---|---|
| *H01L 23/498* | (2006.01) | |
| *H01L 23/31* | (2006.01) | |
| *H01L 23/00* | (2006.01) | |
| *H01L 21/56* | (2006.01) | |
| *H01L 23/538* | (2006.01) | |
| *H01L 25/065* | (2006.01) | |

(52) U.S. Cl.
CPC .. *H01L 23/49816* (2013.01); *H01L 23/49827* (2013.01); *H01L 23/49833* (2013.01); *H01L 23/5385* (2013.01); *H01L 24/13* (2013.01); *H01L 25/0652* (2013.01); *H01L 25/0655* (2013.01); *H01L 25/0657* (2013.01); *H01L 2224/13101* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/14181* (2013.01); *H01L 2224/16227* (2013.01); *H01L 2224/32225* (2013.01); *H01L 2224/73204* (2013.01); *H01L 2224/81191* (2013.01); *H01L 2224/81192* (2013.01); *H01L 2224/81815* (2013.01); *H01L 2224/92125* (2013.01); *H01L 2224/97* (2013.01); *H01L 2225/06517* (2013.01); *H01L 2225/06548* (2013.01); *H01L 2225/06572* (2013.01); *H01L 2924/1431* (2013.01); *H01L 2924/15159* (2013.01); *H01L 2924/15311* (2013.01); *H01L 2924/181* (2013.01); *H01L 2924/18161* (2013.01); *H01L 2924/3512* (2013.01); *H01L 2924/37001* (2013.01)

(58) Field of Classification Search
CPC . H01L 2224/13101; H01L 2224/13025; H01L 2224/16235
USPC .......................................................... 257/737
See application file for complete search history.

(56) References Cited

U.S. PATENT DOCUMENTS

| | | | | |
|---|---|---|---|---|
| 10,978,410 | B2* | 4/2021 | Liu | ................... H01L 23/49838 |
| 2015/0137388 | A1* | 5/2015 | Kim | ..................... H01L 23/481 |
| | | | | 257/774 |
| 2018/0233462 | A1* | 8/2018 | Gong | ................... H01L 21/565 |

* cited by examiner

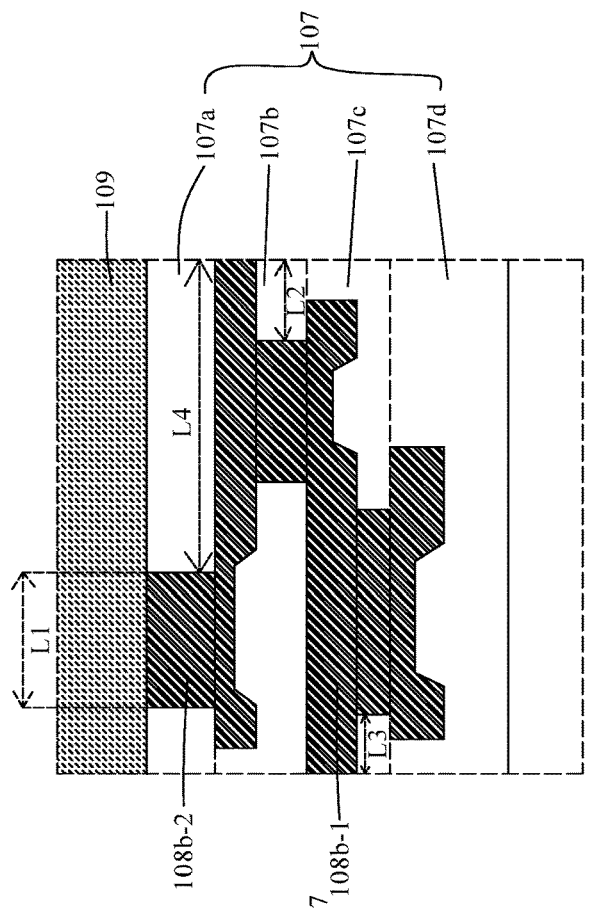
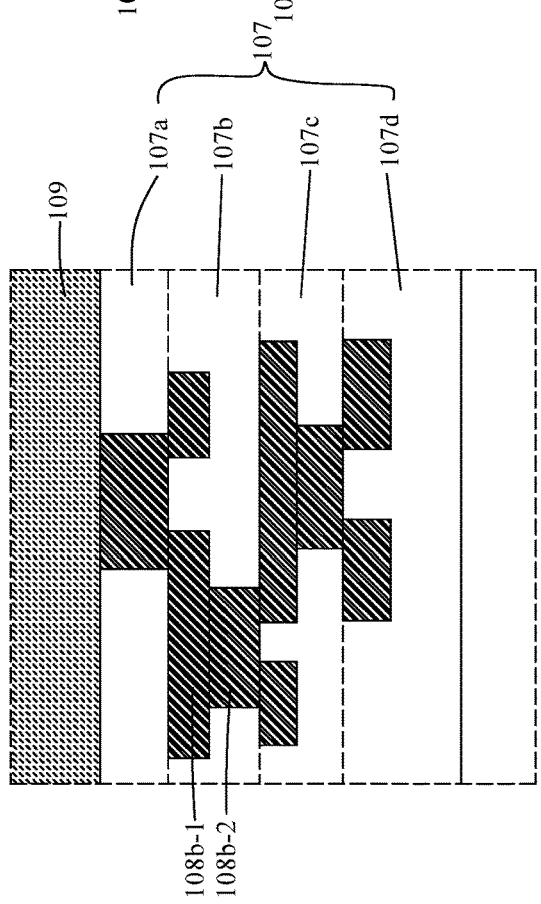
FIG. 1B
FIG. 1A

SEMICONDUCTOR STRUCTURE AND MANUFACTURING METHOD THEREOF

CROSS REFERENCE TO RELATED APPLICATIONS

This application is a continuation of U.S. patent application Ser. No. 16/717,329 filed on Dec. 17, 2019, entitled of "SEMICONDUCTOR STRUCTURE AND MANUFACTURING METHOD THEREOF", which is a continuation of U.S. patent application Ser. No. 15/676,375, entitled "SEMICONDUCTOR STRUCTURE AND MANUFACTURING METHOD THEREOF" filed on Aug. 14, 2017. The entire contents of all of which are hereby incorporated by reference.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS) is widely used to integrate several chips into a single semiconductor device by through silicon via (TSV). During the CoWoS operation, a number of chips are assembled on a single semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and B are schematic enlarged views of a second conductive structure in various structural configurations.

DETAILED DESCRIPTION OF THE DISCLOSURE

Figure 1:
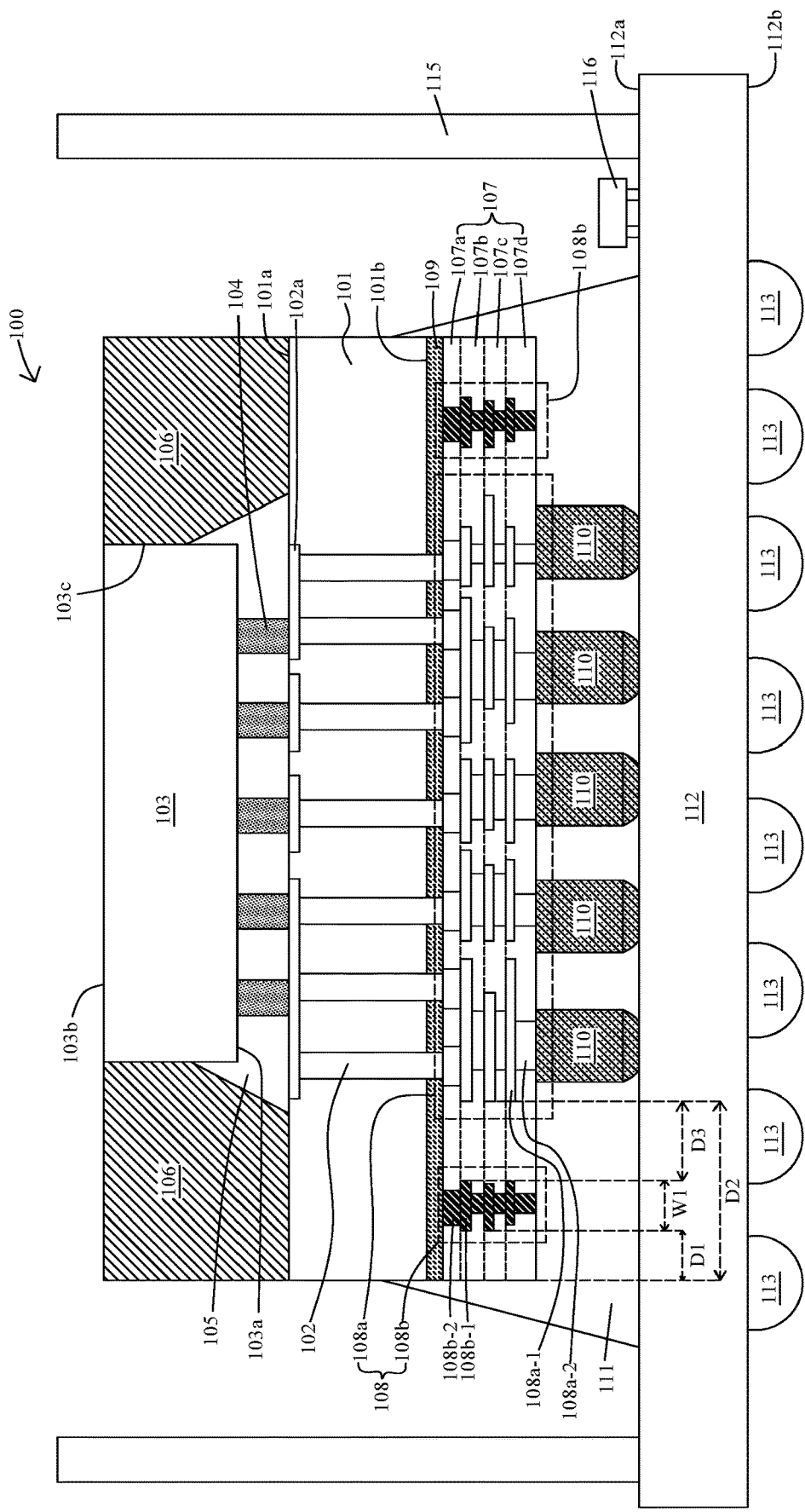
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor chip is manufactured by a number of operations. During the manufacturing process, the semiconductor chips with different functionalities and dimensions are integrated into a single module. Several semiconductor chips are disposed over a substrate and then singulated to become a semiconductor device. Upon singulation, some chippings are peeled off from the semiconductor chips or some cracks are developed and propagated into the semiconductor chips. The chippings and cracks would cause structural damages to the semiconductor chip.

In the present disclosure, a semiconductor structure is disclosed. The semiconductor structure includes a die disposed over a first surface of a substrate, a redistribution layer (RDL) disposed over a second surface of the substrate, and a conductive bump disposed over the RDL. A conductive structure is disposed within the RDL, extended along an edge of the RDL, surrounds components and interconnections disposed on or within the RDL and the substrate, and configured as a seal ring to protect the RDL and the substrate from damages caused by cracks, chippings or other contaminants during fabrication or singulation. As such, delamination of components or damages on the semiconductor structure during fabrication or singulation can be minimized or prevented.

FIG. 1 is a schematic cross sectional view of a semiconductor structure 100 in accordance with various embodiments of the present disclosure. In some embodiments, the semiconductor structure 100 includes a first substrate 101, a via 102, a die 103 and a redistribution layer (RDL) (107, 108).

In some embodiments, the semiconductor structure 100 is a semiconductor package. In some embodiments, the semiconductor structure 100 is an integrated fan out (InFO) package, where I/O terminals of the die 103 are fanned out and redistributed over a surface of the die 103 in a greater area. In some embodiments, the semiconductor structure 100 is a chip on wafer on substrate (CoWoS) packaging structure. In some embodiments, the semiconductor structure 100 is a system on integrated chips (SoIC) packaging structure. In some embodiments, the semiconductor structure 100 is a three dimensional integrated circuit (3D IC).

In some embodiments, the first substrate 101 is a semiconductive substrate. In some embodiments, the first substrate 101 includes semiconductive material such as silicon, germanium, gallium, arsenic, or combinations thereof. In some embodiments, the first substrate 101 is an interposer or the like. In some embodiments, the first substrate 101 is a silicon substrate or silicon interposer. In some embodiments, the first substrate 101 includes material such as ceramic, glass, polymer or the like. In some embodiments, the first substrate 101 includes organic material. In some embodiments, the first substrate 101 has a quadrilateral, rectangular, square, polygonal or any other suitable shape.

In some embodiments, the first substrate 101 includes a first surface 101a and a second surface 101b opposite to the first surface 101a. In some embodiments, a via 102 is disposed within the first substrate 101. In some embodiments, the via 102 extends through the first substrate 101. In some embodiments, the via 102 is extended between the first surface 101a and the second surface 101b of the first substrate 101. In some embodiments, the via 102 includes a conductive material such as copper, silver, gold, aluminum, etc. In some embodiments, the via 102 is a through substrate via or a through silicon via (TSV). In some embodiments, a distance between two adjacent vias is about 40 µm to about 70 µm. In some embodiments, the distance between two adjacent vias is about 60 µm. In some embodiments, a width of the via 102 is about 8 µm to about 15 µm. In some embodiments, the width of the via 102 is about 10 µm.

In some embodiments, a conductive pad 102a is disposed over the via 102. In some embodiments, the conductive pad 102a is electrically connected to the via 102. In some embodiments, the conductive pad 102a is disposed over the first surface 101a of the first substrate 101. In some embodiments, the conductive pad 102a is surrounded by the first substrate 101. In some embodiments, the conductive pad 102a includes a conductive material such as chromium, copper, gold, titanium, silver, nickel, palladium or tungsten, etc. In some embodiments, the conductive pad 102a is a solderable surface and serves as a platform for receiving a conductive structure.

In some embodiments, the die 103 is disposed over the first substrate 101. In some embodiments, the die 103 is disposed over the first surface 101a of the first substrate 101. In some embodiments, the die 103 is fabricated with a predetermined functional circuit within the die 103. In some embodiments, the die 103 is singulated from a semiconductive wafer by a mechanical or laser blade. In some embodiments, the die 103 comprises a variety of electrical circuits suitable for a particular application. In some embodiments, the electrical circuits include various devices such as transistors, capacitors, resistors, diodes and/or the like. In some embodiments, the die 103 is a logic device die, graphics processing unit (GPU) die, application processing (AP) die, memory die, high bandwidth memory (HBM) die or the like. In some embodiments, the die 103 is a chip or a package. In some embodiments, the die 103 has a top cross section (a cross section from the top view of the semiconductor structure 100 as shown in FIG. 1) in a quadrilateral, a rectangular or a square shape.

In some embodiments, the die 103 includes a front side 103a, a back side 103b opposite to the front side 103a and a sidewall 103c between the front side 103a and the back side 103b. In some embodiments, the sidewall 103c is substantially orthogonal to the front side 103a or the back side 103b. In some embodiments, the front side 103a is an active side that several electrical components are disposed thereon. In some embodiments, the back side 103b is an inactive side that electrical component disposed thereon is absent.

In some embodiments, a first conductive bump 104 is disposed between the first substrate 101 and the die 103. In some embodiments, the first conductive bump 104 is disposed between the front side 103a of the die 103 and the first surface 101a of the first substrate 101. In some embodiments, the die 103 is bonded with the first substrate 101 by the first conductive bump 104. In some embodiments, the first conductive bump 104 is electrically connected to the via 102. In some embodiments, the first conductive bump 104 is bonded with the via 102 or the conductive pad 102a.

In some embodiments, the first conductive bump 104 is in a cylindrical, spherical or hemispherical shape. In some embodiments, the first conductive bump 104 is a solder joint, a solder bump, a solder ball, a ball grid array (BGA) ball, a controlled collapse chip connection (C4) bump, microbump or the like. In some embodiments, the first conductive bump 104 is a conductive pillar or post. In some embodiments, the first conductive bump 104 includes metals such as lead, tin, copper, gold, nickel, etc. In some embodiments, a distance between two adjacent first conductive bumps 104 is about 150 µm to about 200 µm. In some embodiments, the distance between two adjacent first conductive bumps 104 is about 180 µm.

In some embodiments, a first underfill material 105 is disposed over the first substrate 101 and surrounds the first conductive bump 104 and the die 103. In some embodiments, the first underfill material 105 is disposed over the first surface 101a of the first substrate 101. In some embodiments, the first underfill material 105 encapsulates the first conductive bump 104. In some embodiments, the first underfill material 105 is in contact with the first surface 101a of the first substrate 101, the front side 103a of the die 103 and the sidewall 103c of the die 103. In some embodiments, a portion of the sidewall 103c is covered by the first underfill material 105. In some embodiments, the first underfill material 105 fills spacing between two adjacent first conductive bumps 104. In some embodiments, the first underfill material 105 is an electrically insulated adhesive for protecting the first conductive bump 104 or securing a bonding between the die 103 and the first substrate 101. In some embodiments, the first underfill material 105 includes epoxy, resin, epoxy molding compounds or etc.

In some embodiments, a molding 106 is disposed over the first substrate 101 and surrounds the die 103. In some embodiments, the molding 106 is disposed over the first surface 101a of the first substrate 101 and surrounds the die 103, the first underfill material 105 and the first conductive bump 104. In some embodiments, the molding 106 is in contact with the sidewall 103c of the die 103, the first underfill material 105 and the first surface 101a of the first substrate 101. In some embodiments, the back side 103b of the die 103 is exposed from the molding 106. In some embodiments, the molding 106 can be a single layer film or a composite stack. In some embodiments, the molding 106 includes various materials, such as molding compound, molding underfill, epoxy, resin, or the like. In some embodiments, the molding 106 has a high thermal conductivity, a low moisture absorption rate and a high flexural strength.

In some embodiments, the RDL (107, 108) is disposed over the second surface 101b of the first substrate 101. In some embodiments, the RDL (107, 108) is configured to re-route a path of circuitry from the die 103 and redistribute I/O terminals of the die 103. In some embodiments, the RDL (107, 108) includes a dielectric layer 107 disposed over the second surface 101b of the first substrate 101 and several conductive structures 108 disposed within the dielectric layer 107.

In some embodiments, the dielectric layer 107 is in contact with the second surface 101b of the first substrate 101. In some embodiments, the dielectric layer 107 includes several layers (107a, 107b, 107c, 107d) stacking over each other. Although FIG. 1 shows the dielectric layer 107 includes 4 dielectric layers (107a, 107b, 107c, 107d), it would be understood that the dielectric layer 107 is not limited to include 4 dielectric layers (107a, 107b, 107c, 107d). The dielectric layer 107 can include one or more dielectric layers.

In some embodiments, the dielectric layer 107 includes polymeric material. In some embodiments, the dielectric layer 107 includes polyimide (PI), polybenzoxazole (PBO) or the like. In some embodiments, the dielectric layer 107 includes polyimide (PI) which is curable at a low temperature (i.e. substantially lower than about 400° C. or in a range of about 200'C to 300° C.). In some embodiments, the dielectric layer 107 includes polybenzoxazole (PBO) which is curable at a high temperature (i.e. substantially greater than about 400'C). In some embodiments, each layer (107a, 107b, 107c, 107d) of the dielectric layer 107 includes dielectric material different from or same as each other. In some embodiments, the dielectric layer 107 is transparent or is penetrable by visible light.

In some embodiments, a thickness of the dielectric layer 107 is about 20 μm to about 50 μm. In some embodiments, the thickness of the dielectric layer 107 is about 30 μm to 401 μm. In some embodiments, a thickness of one layer (107a, 107b, 107c, 107d) of the dielectric layer 107 is about 3 μm to about 13 μm. In some embodiments, a thickness of one layer (107a, 107b, 107c, 107d) of the dielectric layer 107 is about 5 μm to about 8 μm. In some embodiments, the thickness of one layer (107a, 107b, 107c, 107d) of the dielectric layer 107 is about 7 μm.

In some embodiments, the conductive structures 108 are disposed within the dielectric layer 107. In some embodiments, the conductive structures 108 include conductive material such as gold, silver, copper, nickel, tungsten, aluminum, tin and/or alloys thereof. In some embodiments, the conductive structure 108 extends through one or more layers (107a, 107b, 107c, 107d) of the dielectric layer 107. In some embodiments, the conductive structures 108 include a first conductive structure 108a and a second conductive structure 108b.

In some embodiments, the first conductive structure 108a is disposed within the dielectric layer 107 and electrically connected to the via 102. In some embodiments, the first conductive structure 108a is disposed at a central portion of the dielectric layer 107. In some embodiments, the first conductive structure 108a is electrically connected to the via 102. In some embodiments, the first conductive structure 108a is electrically connected to the die 103 through the via 102. In some embodiments, the first conductive structure 108a is extended through at least one layer of the dielectric layer 107. In some embodiments, a distance D2 between the first conductive structure 108a and an edge of the dielectric layer 107 (or an edge of the RDL 107, 108) is about 100 μm to about 130 μm. In some embodiments, the distance D2 is about 110 μm.

In some embodiments, the first conductive structure 108a includes a first land portion 108a-1 and a first via portion 108a-2 coupled with the first land portion 108a-1. In some embodiments, the first land portion 108a-1 is laterally extended within the dielectric layer 107. In some embodiments, the first via portion 108a-2 is vertically extended within the dielectric layer 107 and passes through at least one layer of the dielectric layer 107. In some embodiments, the first land portion 108a-1 and the first via portion 108a-2 are stacked over each other. In some embodiments, the first land portion 108a-1 and the first via portion 108a-2 are stacked alternately.

In some embodiments, the second conductive structure 108b is disposed within the dielectric layer 107 and electrically isolated from the via 102. In some embodiments, the second conductive structure 108b is disposed adjacent to the edge of the dielectric layer 107. In some embodiments, the second conductive structure 108b is disposed adjacent to the first conductive structure 108a. In some embodiments, the second conductive structure 108b is extended through at least one layer of the dielectric layer 107. In some embodiments, the second conductive structure 108b is electrically isolated from the die 103. In some embodiments, the second conductive structure 108b is a dummy structure. In some embodiments, the second conductive structure 108b is a seal ring and is configured as a barrier for preventing contaminants such as chippings, moisture, chemicals, corrosive material or etc. from penetrating into the semiconductor structure 100 or the dielectric layer 107 and preventing cracks from propagating into the semiconductor structure 100 or the dielectric layer 107 upon singulation or sawing operations.

Figure 2:
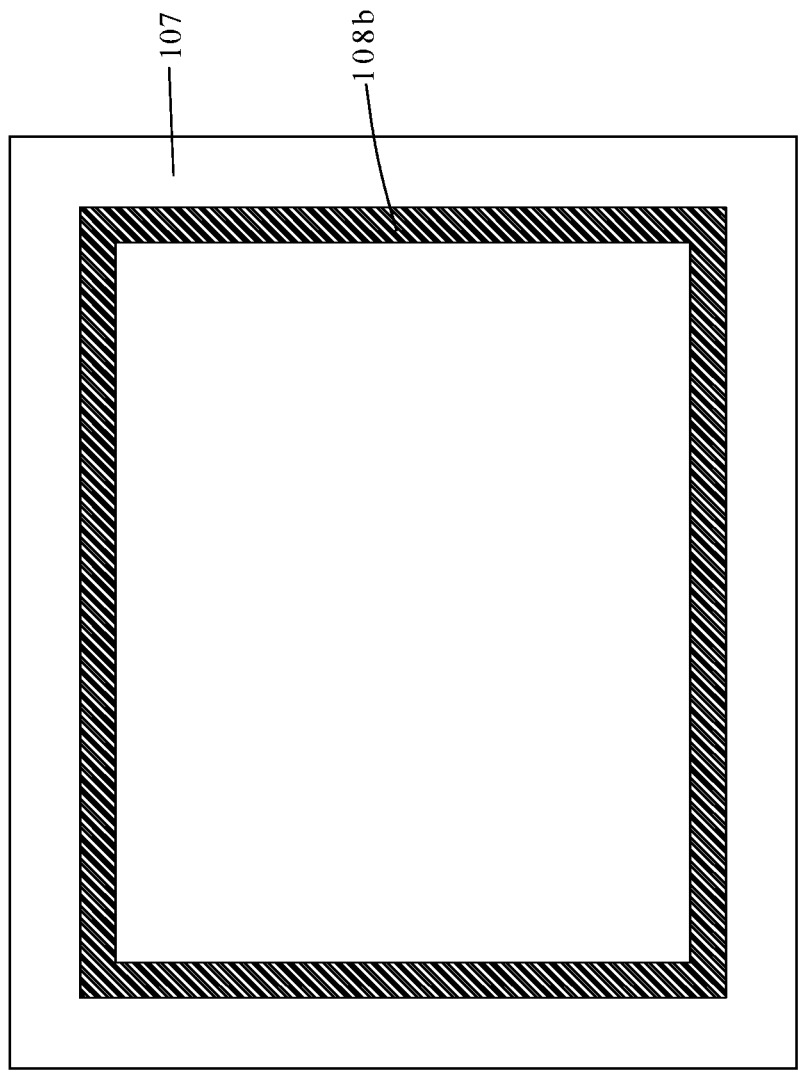
FIG. 2 is a schematic top cross sectional view of a dielectric layer and a conductive structure in FIG. 1.

In some embodiments, the second conductive structure 108b is extended along the edge of the dielectric layer 107, as shown in FIG. 2. In some embodiments, the second conductive structure 108b is extended to surround the first conductive structure 108a. In some embodiments, a top cross section of the second conductive structure 108b is in a strip or frame shape. In some embodiments, the second conductive structure 108b is visible through the dielectric layer 107 under visible light.

In some embodiments, a width W1 of the second conductive structure 108b is about 30 μm to about 70 μm. In some embodiments, the width W1 is about 50 μm. In some embodiments, a distance D1 between the edge of the dielectric layer 107 and the second conductive structure 108b is substantially less than the distance D2 between the edge of the dielectric layer 107 and the first conductive structure 108a. In some embodiments, the distance D1 is about 35 μm to about 55 μm. In some embodiments, the distance D1 is about 45 μm. In some embodiments, a distance D3 between the first conductive structure 108a and the second conductive structure 108b is about 15 μm to about 30 μm. In some embodiments, the distance D3 is about 20 μm.

In some embodiments, the second conductive structure 108b includes a second land portion 108b-1 and a second via portion 108b-2 coupled with the second land portion 108b-1. In some embodiments, the second land portion 108b-1 is laterally extended within the dielectric layer 107. In some embodiments, the second via portion 108b-2 is vertically extended within the dielectric layer 107 and passes through at least one layer of the dielectric layer 107. In some embodiments, the second land portion 108b-1 and the second via portion 108b-2 are stacked over each other. In some embodiments, the second land portion 108b-1 and the second via portion 108b-2 are stacked alternately. In some embodiments, the second land portion 108b-1 and the second via portion 108b-2 are electrically isolated from the via 102.

In some embodiments, the second conductive structure 108b has various structural configurations as shown in FIGS. 1A and 1B. In some embodiments, the second conductive structure 108b includes several second land portions 108b-1 laterally extended over one layer (107a, 107b, 107c or 107d) of the dielectric layer 107, and several second via portions 108b-2 vertically extended from one of the second land portions 108b-1 in one layer (107a, 107b, 107c or 107d) of the dielectric layer 107.

In some embodiments, the via portions 108b-2 are in various lengths extended along one layer (107a, 107b, 107c or 107d) of the dielectric layer 107. In some embodiments, a length L1 of the via portion 108b-2 in one layer (107a, 107b, 107c or 107d) of the dielectric layer 107 is about 10 μm to about 15 μm. In some embodiments, the length L1 is about 14 μm. In some embodiments, a length L2 between the via portion 108b-2 and the edge of the dielectric layer 107 is about 45 μm to about 50 μm. In some embodiments, the length L2 is about 48 μm. In some embodiments, a length L3 between the via portion 108b-2 and the first conductive structure 108a is about 25 μm to about 30 μm. In some embodiments, the length L3 is about 27 μm. In some embodiments, a length L4 of the land portion 108b-1 protruded from the via portion 108b-2 is about 25 μm to about 30 μm. In some embodiments, the length L4 is about 28 μm. In some embodiments, the length L4 is about 5 μm to about 15 μm. In some embodiments, the length LA is about 10 μm. In some embodiments, the length L4 is about 7 μm. In some embodiments, the length L4 is about 1 μm to about 5 μm. In some embodiments, the length L4 is about 3 μm.

In some embodiments, a barrier layer 109 is disposed between the first substrate 101 and the dielectric layer 107. In some embodiments, the barrier layer 109 is configured to prevent the conductive structures 108 diffusing into the first substrate 101. In some embodiments, the barrier layer 109 surrounds a portion of the via 102. In some embodiments, the barrier layer 109 is disposed between the first substrate 101 and the second conductive structure 108b. In some embodiments, the second conductive structure 108b is in contact with the barrier layer 109. In some embodiments, the second conductive structure 108b is separated from the first substrate 101 by the barrier layer 109. In some embodiments, the barrier layer 109 includes nitride. In some embodiments, the barrier layer 109 includes nitride which is curable under a low temperature (i.e. substantially lower than 400° C.).

In some embodiments, the RDL (107, 108) is disposed over a second substrate 112. In some embodiments, the second substrate 112 is fabricated with a predetermined functional circuit thereon. In some embodiments, the second substrate 112 includes several conductive traces and several electrical components such as transistor, diode, etc. disposed within the second substrate 112. In some embodiments, the second substrate 112 includes semiconductive material such as silicon, germanium, gallium, arsenic, or combinations thereof. In some embodiments, the second substrate 112 includes material such as ceramic, glass, polymer or the like. In some embodiments, the second substrate 112 is a silicon substrate. In some embodiments, the second substrate 112 is a printed circuit board (PCB). In some embodiments, the second substrate 112 has a quadrilateral, rectangular, square, polygonal or any other suitable shape.

In some embodiments, the second substrate 112 includes a third surface 112a and a fourth surface 112b opposite to the third surface 112a. In some embodiments, the third surface 112a faces to the dielectric layer 107. In some embodiments the RDL (107, 108) is disposed between the first substrate 101 and the second substrate 112. In some embodiments, the dielectric layer 107, the first conductive structure 108a and the second conductive structure 108b are disposed between the first substrate 101 and the second substrate 112.

In some embodiments, a connector 113 is disposed over the fourth surface 112b of the second substrate 112. In some embodiments, the connector 113 is configured to bond over another substrate or package and to electrically connect a circuitry of the second substrate 112 with a circuitry of another substrate or package. In some embodiments, the connector 113 is a solder joint, a solder bump, a solder ball, a ball grid array (BGA) ball, a controlled collapse chip connection (C4) bump, microbump, a conductive pillar, post or the like. In some embodiments, the connector 113 includes metals such as lead, tin, copper, gold, nickel, etc.

In some embodiments, a second conductive bump 110 is disposed between the second substrate 112 and the RDL (107, 108). In some embodiments, the second conductive bump 110 is disposed between the third surface 112a of the second substrate 112 and the dielectric layer 107. In some embodiments, the second conductive bump 110 is disposed over the first conductive structure 108a. In some embodiments, the first conductive structure 108a is bonded with the second substrate 112 by the second conductive bump 110. In some embodiments, a circuitry of the second substrate 112 is electrically connected to the die 103 through the second conductive bump 110, the first conductive structure 108a, the via 102 and the first conductive bump 104.

In some embodiments, the second conductive bump 110 disposed over the second conductive structure 108b is absent. In some embodiments, the second conductive bump 110 is electrically isolated from the second conductive structure 108b. In some embodiments the second conductive bump 110 is separated from and is not in contact with the second conductive structure 108b. In some embodiments, the second conductive member 108b is electrically isolated from the via 102, the second conductive bump 110 and the first conductive structure 108a. In some embodiments, the RDL (107, 108) is disposed between the via 102 and the second conductive bump 110.

In some embodiments, the second conductive bump 110 is in a cylindrical, spherical or hemispherical shape. In some embodiments, the second conductive bump 110 is a solder joint, a solder bump, a solder ball, a ball grid array (BGA) ball, a controlled collapse chip connection (C4) bump, microbump or the like. In some embodiments, the second conductive bump 110 is a conductive pillar or post. In some embodiments, the second conductive bump 110 includes metals such as lead, tin, copper, gold, nickel, etc.

In some embodiments, a second underfill material 111 is disposed over the second substrate 112 and surrounds the first substrate 101, the RDL (107, 108) and the second conductive bump 110. In some embodiments, the second underfill material 111 is disposed over the third surface 112a of the second substrate 112. In some embodiments, the second underfill material 111 encapsulates the second conductive bump 110. In some embodiments, the second underfill material 111 is in contact with a sidewall of the first substrate 101, the dielectric layer 107 and the third surface 112a of the second substrate 112. In some embodiments, a portion of the third surface 112a of the second substrate 112 is exposed from the second underfill material 111. In some embodiments, a portion of the sidewall of the first substrate 101 is covered by the second underfill material 111. In some embodiments, the second underfill material 111 fills spacing between two adjacent second conductive bumps 110. In some embodiments, the second underfill material 111 is an electrically insulated adhesive for protecting the second conductive bump 110 or securing a bonding between the first substrate 101 and the second substrate 112 or between the dielectric layer 107 and the second substrate 112. In some embodiments, the second underfill material 111 includes epoxy, resin, epoxy molding compounds or etc.

In some embodiments, a stiffener 115 is disposed over the third surface 112a of the second substrate 112 and surround the molding 106, the first substrate 110 and the second underfill material 111. In some embodiments, the stiffener is disposed over the molding 106. In some embodiments, the stiffener 115 is in an annular shape.

In some embodiments, a device 116 is disposed over the third surface 112a of the second substrate 112. In some embodiments, the device 116 is disposed between the second underfill material 111 and the stiffener 115. In some embodiments, the device 116 is a surface mount device (SMD).

Figure 3:
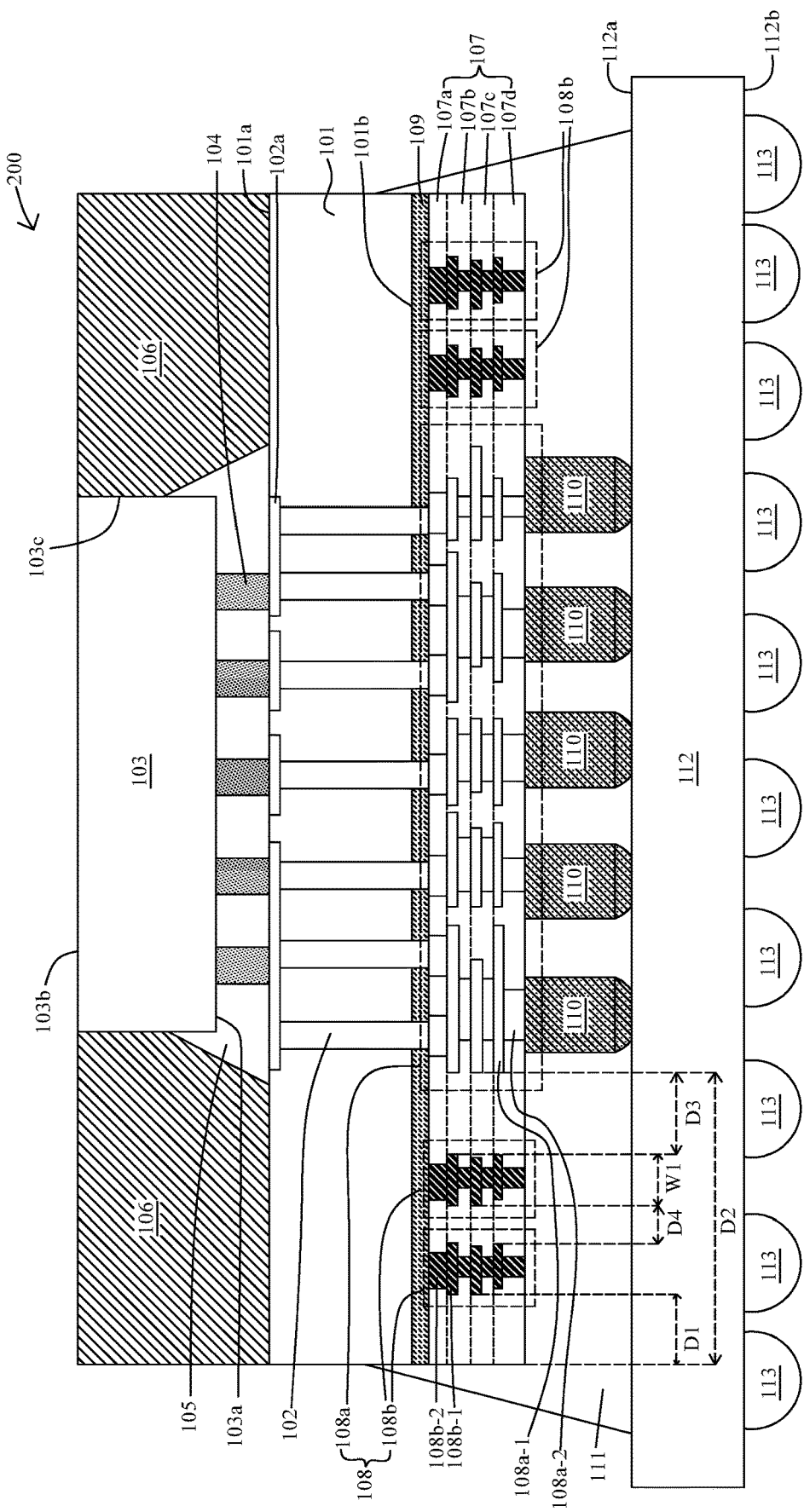
FIG. 3 is a schematic cross sectional view of a semiconductor structure in accordance with some embodiments of the present disclosure.

FIG. 3 is a schematic cross sectional view of a semiconductor structure 200 in accordance with various embodiments of the present disclosure. In some embodiments, the semiconductor structure 200 includes a first substrate 101, a via 102, a die 103, a first conductive bump 104, a first underfill material 105, a molding 106, a RDL (107, 108), a barrier layer 109, a second conductive bump 110, a second underfill material 111, a second substrate 112 and a connector 113, which have similar configurations as those described above or illustrated in FIG. 1.

In some embodiments, the RDL (107, 108) includes two second conductive structures 108b disposed adjacent to an edge of the dielectric layer 107. In some embodiments, one of the two second conductive structures 108b is disposed between the first conductive structure 108a and another one of the two second conductive structures 108b. In some embodiments, the two second conductive structures 108b are electrically isolated from the via 102, the second conductive bump 110 and the first conductive structure 108a. Although two second conductive structures 108b are illustrated in FIG. 3, it would be understood that one or more second conductive structures 108b can be included in the dielectric layer 107. In some embodiments, the two second conductive structures 108b have similar configuration as the second conductive structure 108b described above or illustrated in FIG. 1.

Figure 4:
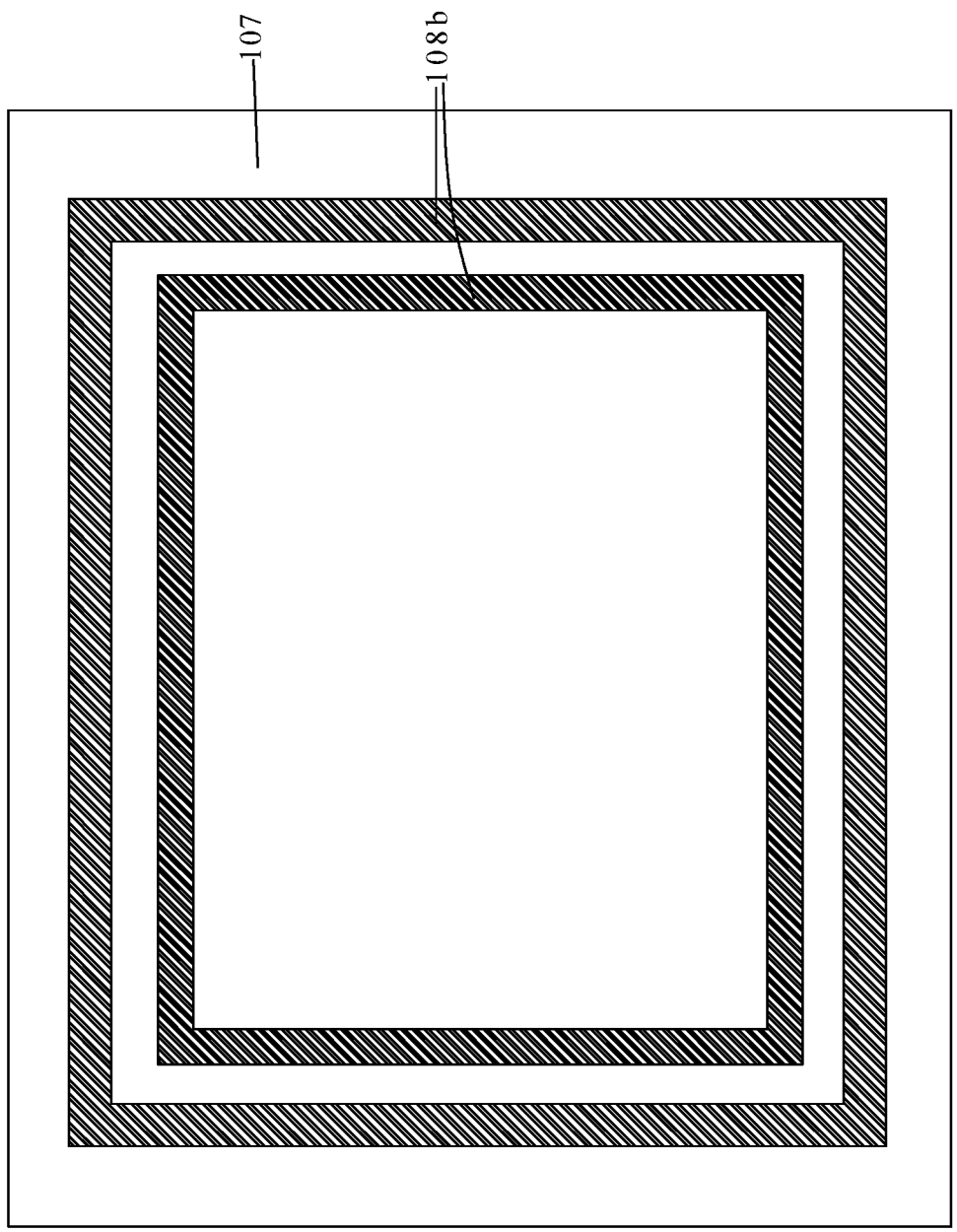
FIG. 4 is a schematic top cross sectional view of a dielectric layer and a conductive structure in FIG. 3.

In some embodiments, the two second conductive structures 108b are extended along the edge of the dielectric layer 107, as shown in FIG. 4. In some embodiments, the two second conductive structures 108b are extended to surround the first conductive structure 108a. In some embodiments, top cross sections of the two second conductive structures 108b are in a strip or frame shape. In some embodiments, the two second conductive structures 108b are visible through the dielectric layer 107 under visible light. In some embodiments, a distance D4 between the two second conductive structures 108b is about 8 µm to about 15 µm. In some embodiments, the distance D4 is about 12 µm.

Figure 5:
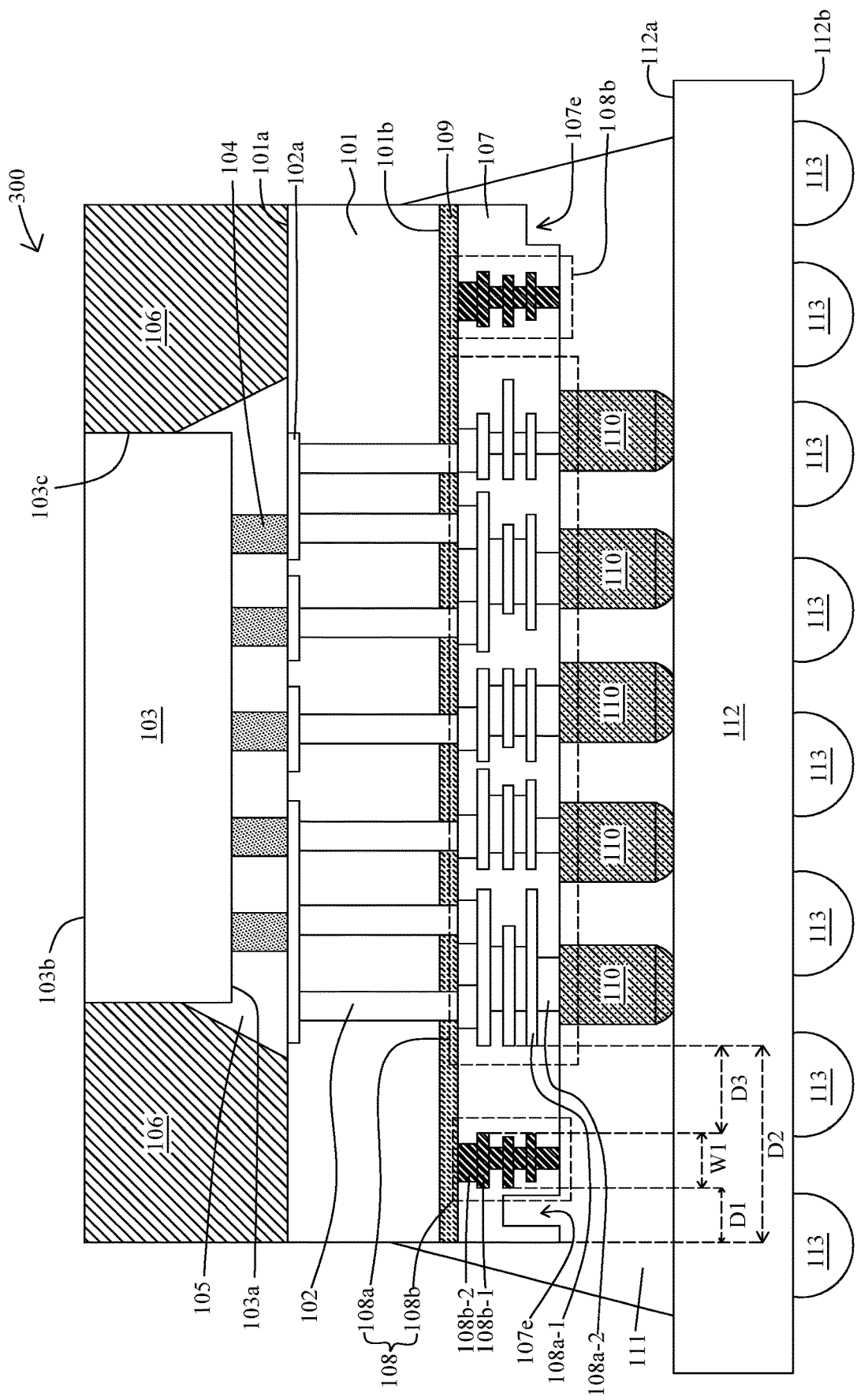
FIG. 5 is a schematic cross sectional view of a semiconductor structure including a recess in accordance with some embodiments of the present disclosure.

FIG. 5 is a schematic cross sectional view of a semiconductor structure 300 in accordance with various embodiments of the present disclosure. In some embodiments, the semiconductor structure 300 includes a first substrate 101, a via 102, a die 103, a first conductive bump 104, a first underfill material 105, a molding 106, a RDL (107, 108), a barrier layer 109, a second conductive bump 110, a second underfill material 111, a second substrate 112 and a connector 113, which have similar configurations as those described above or illustrated in FIG. 1 or 3.

In some embodiments, a recess 107e is disposed over the dielectric layer 107. In some embodiments, the recess 107e is indented into the dielectric layer 107 towards the first substrate 101. In some embodiments, the recess 107e is indented from the dielectric layer towards the second surface 101b of the first substrate 101. In some embodiments, the recess 107e is configured to prevent chippings from damaging the dielectric layer 107 or the semiconductor structure 300 or prevent cracks propagating into the dielectric layer 107 or the semiconductor structure 300 upon fabrication or singulation operations. In some embodiments, the recess 107e is served as a crack stopper. In some embodiments, the recess 107e is disposed adjacent to the second conductive structure 108b. In some embodiments, a distance between the recess 107e and the second conductive structure 108b is substantially less than a distance between the recess 107e and the first conductive structure 108a. In some embodiments, a width of the recess 107e is about 30 µm to about 50 µm. In some embodiments, the recess 107e is about 40 µm.

Figure 6:
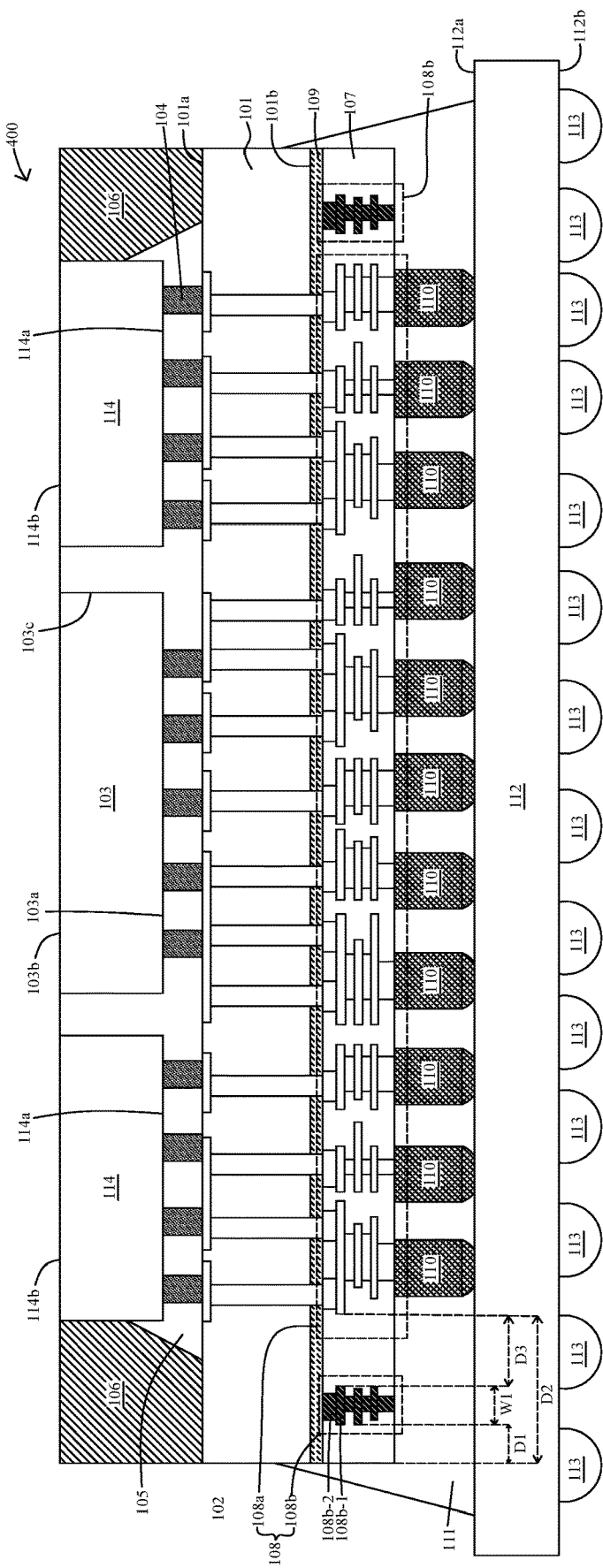
FIG. 6 is a schematic cross sectional view of a semiconductor structure including several dies in accordance with some embodiments of the present disclosure.

FIG. 6 is a schematic cross sectional view of a semiconductor structure 400 in accordance with various embodiments of the present disclosure. In some embodiments, the semiconductor structure 400 includes a first substrate 101, a via 102, a die 103, a first conductive bump 104, a first underfill material 105, a molding 106, a RDL (107, 108), a barrier layer 109, a second conductive bump 110, a second underfill material 111, a second substrate 112 and a connector 113, which have similar configurations as those described above or illustrated in FIG. 1, 3 or 5.

In some embodiments, the semiconductor structure 400 includes a second die 114 disposed adjacent to the die 103. In some embodiments, the second die 114 is disposed over the first surface 101a of the first substrate 101. In some embodiments, the second die 114 is fabricated with a predetermined functional circuit within the second die 114. In some embodiments, the second die 114 is singulated from a semiconductive wafer by a mechanical or laser blade. In some embodiments, the second die 114 comprises a variety of electrical circuits suitable for a particular application. In some embodiments, the electrical circuits include various devices such as transistors, capacitors, resistors, diodes and/or the like. In some embodiments, the second die 114 is high bandwidth memory (HBM) die or the like. In some embodiments, the second die 114 is a chip or a package. In some embodiments, the second die 114 has a top cross section (a cross section from the top view of the semiconductor structure 400 as shown in FIG. 6) in a quadrilateral, a rectangular or a square shape.

In some embodiments, the second die 114 includes a second front side 114a, a second back side 114b opposite to the second front side 103a. In some embodiments, the second front side 103a is an active side that several electrical components are disposed thereon. In some embodiments, the second back side 114b is an inactive side that electrical component disposed thereon is absent. In some embodiments, the second back side 114b is exposed from the molding 106.

Figure 7:
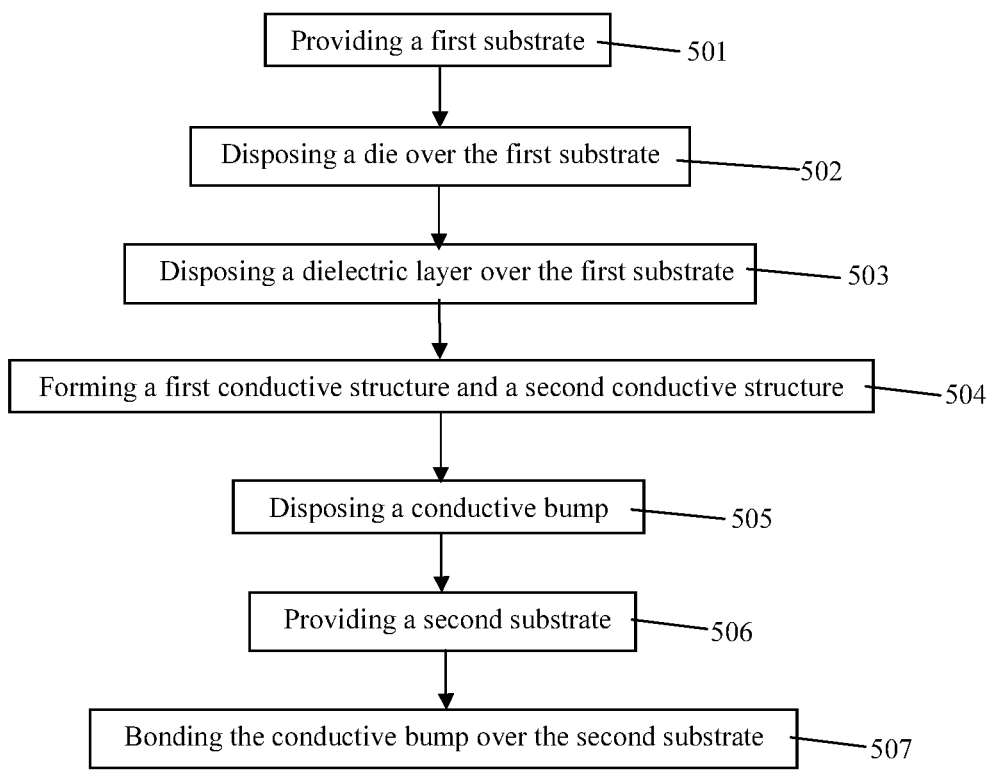
FIG. 7 is a flow diagram of a method of manufacturing a semiconductor structure in accordance with some embodiments of the present disclosure.

In the present disclosure, a method of manufacturing a semiconductor structure (100, 200, 300 400) is also disclosed. In some embodiments, the semiconductor structure (100, 200, 300 400) is formed by a method 500. The method 500 includes a number of operations and the description and illustration are not deemed as a limitation as the sequence of the operations. FIG. 7 is an embodiment of the method 500 of manufacturing the semiconductor structure (100, 200, 300, 400). The method 500 includes a number of operations (501, 502, 503, 504, 505, 506 and 507).

Figure 7A:
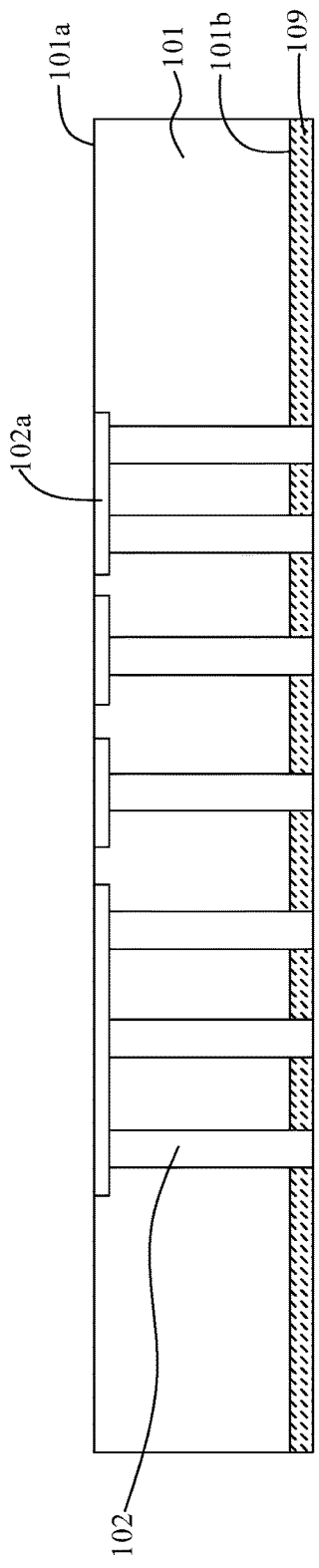
FIGS. 7A-7K are schematic views of manufacturing a semiconductor structure by a method of FIG. 7 in accordance with some embodiments of the present disclosure.

In operation 501, a first substrate 101 is provided or received as shown in FIG. 7A. In some embodiments, the first substrate 101 includes a first surface 101a and a second surface 101b opposite to the first surface 101a. In some embodiments, the first substrate 101 is an interposer. In some embodiments, the first substrate 101 has configuration similar to the one described above or illustrated in FIG. 1, 3, 5 or 6.

In some embodiments, a via 102 is formed within the first substrate 101. In some embodiments, the via 102 is extended through the first substrate 101. In some embodiments, the via 102 is extended between the first surface 101a and the second surface 101b of the first substrate 101. In some embodiments, the via 102 is a through substrate via or a through silicon via (TSV). In some embodiments, the via 102 is formed by removing a portion of the first substrate 101 to form an opening and then disposing a conductive material into the opening to form the via 102. In some embodiments, the removal of the portion of the first substrate 101 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the via 102 has configuration similar to the one described above or illustrated in FIG. 1, 3, 5 or 6.

In some embodiments, a conductive pad 102a is formed over the via 102. In some embodiments, the conductive pad 102a is formed over the first surface 101a of the first substrate 101. In some embodiments, the conductive pad 102a is formed by removing a portion of the first substrate 101 to expose the via 102 and form an opening over the via 102 and then disposing a conductive material into the opening to form the conductive pad 102a. In some embodiments, the removal of the portion of the first substrate 101 to expose the via 102 includes photolithography, etching or any other suitable operations. In some embodiments, the disposing of the conductive material over the via 102 includes sputtering, electroplating or any other suitable operations. In some embodiments, the conductive material includes chromium, copper, gold, titanium, silver, nickel, palladium or tungsten, etc. In some embodiments, the conductive pad 102a has configuration similar to the one described above or illustrated in FIG. 1, 3, 5 or 6.

In some embodiments, a barrier layer 109 is disposed over the second surface 101b of the first substrate 101. In some embodiments, the barrier layer 109 is configured to prevent the conductive material diffusing into the first substrate 101. In some embodiments, the barrier layer 109 surrounds a portion of the via 102. In some embodiments, the barrier layer 109 is disposed by spin coating, deposition, chemical vapor deposition (CVD) or any other suitable operations. In some embodiments, the barrier layer 109 includes nitride. In some embodiments, the barrier layer 109 is cured under a predetermined temperature. In some embodiments, the predetermined temperature is substantially lower than 400° C. In some embodiments, the barrier layer 109 is cured at about 200° C. to about 300° C. In some embodiments, the barrier layer 109 is cured at about 250° C.

Figure 7B:
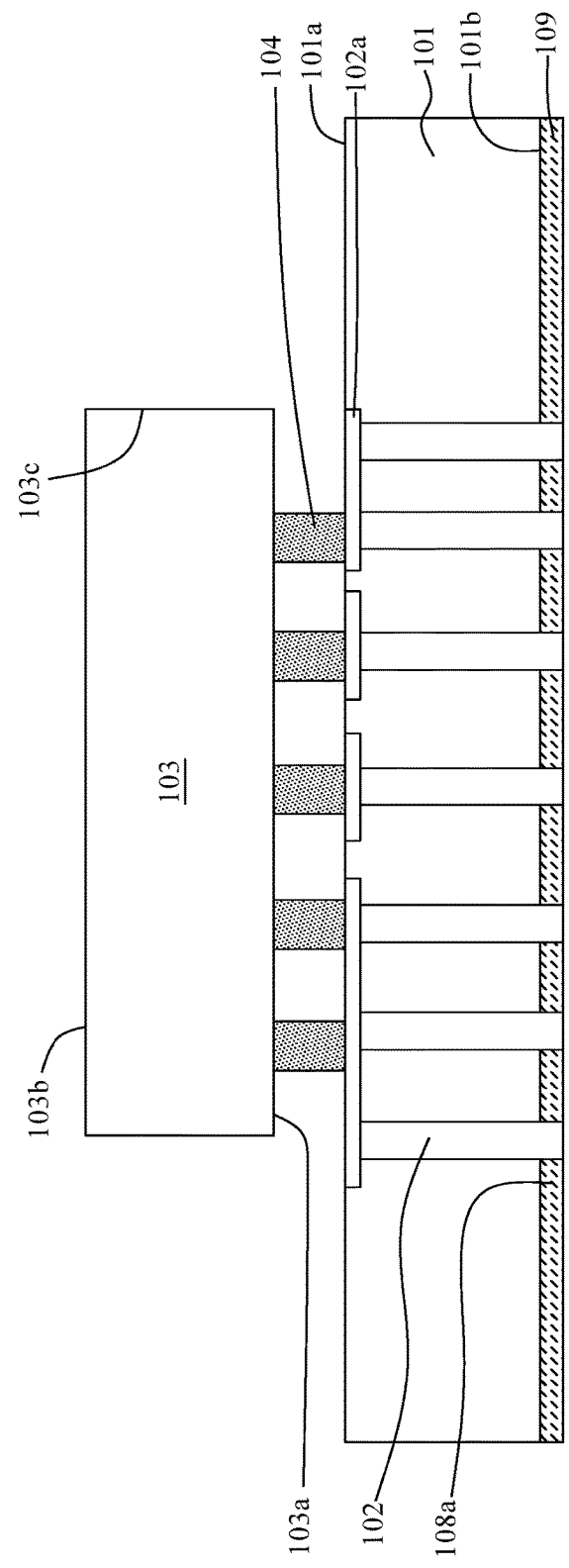

In operation 502, a die 103 is disposed over the first substrate 101 as shown in FIG. 7B. In some embodiments, the die 103 is disposed over the first surface 101a of the first substrate 101. In some embodiments, the die 103 includes a front side 103a, a back side 103b opposite to the front side and a sidewall 103c substantially orthogonal to the front side 103a and the back side 103b. In some embodiments, the die 103 is a logic device die, graphics processing unit (GPU) die, application processing (AP) die, memory die, high bandwidth memory (HBM) die or the like. In some embodiments, the die 103 is a chip or a package. In some embodiments, the die 103 has configuration similar to the one described above or illustrated in FIG. 1, 3, 5 or 6.

In some embodiments, a first conductive bump 104 is disposed over the front side 103a of the die 103. In some embodiments, the first conductive bump 104 is disposed by ball dropping, solder pasting, stencil printing or any other suitable operations. In some embodiments, the first conductive bump 104 is a solder joint, a solder bump, a solder ball, a ball grid array (BGA) ball, a controlled collapse chip connection (C4) bump, microbump or the like. In some embodiments, the first conductive bump 104 is a conductive pillar or post. In some embodiments, the first conductive bump 104 has configuration similar to the one described above or illustrated in FIG. 1, 3, 5 or 6.

In some embodiments, the die 103 is bonded over the first substrate 101 by the first conductive bump 104. In some embodiments, the first conductive bump 104 is bonded with the via 102 or the conductive pad 102a. In some embodiments, the die 103 is electrically connected to the via 102 through the first conductive bump 104. In some embodiments, the first conductive bump 104 is reflowed after disposing over the via 102 or the first conductive pad 102a.

Figure 7C:
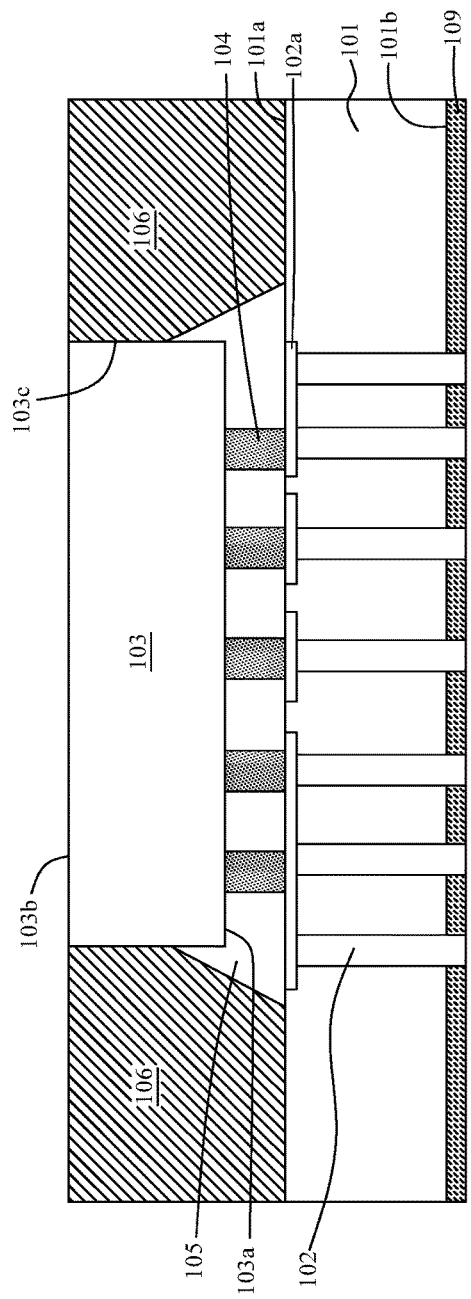

In some embodiments, a first underfill material 105 is disposed over the first substrate 101 and surrounds the first conductive bump 104 and the die 103 after the disposing of the die 103 as shown in FIG. 7C. In some embodiments, the first underfill material 105 surrounds a portion of the die 103 and the first conductive bump 104 and covers a portion of the first surface 101a of the first substrate 101. In some embodiments, the first underfill material 105 fills gap between adjacent first conductive bumps 104. In some embodiments, the first underfill material 105 is disposed by flowing, injection or any other suitable operations. In some embodiments, the first underfill material 105 has configuration similar to the one described above or illustrated in FIG. 1, 3, 5 or 6.

In some embodiments, a molding 106 is formed over the first substrate 101 and surrounds the die 103 after the disposing of the die 103 as shown in FIG. 7C. In some embodiments, the molding 106 is formed to surround the die 103 and the first underfill material 105. In some embodiments, the molding 106 is in contact with a portion of the sidewall 103c of the die 103, the first underfill material 105 and the first surface 101a of the first substrate 101. In some embodiments, the molding 106 is formed by transfer molding, injection molding, over molding or any other suitable operations. In some embodiments, the back side 103b of the die 103 is exposed from the molding 106. In some embodiments, the molding 106 is ground to expose the back side 103b of the die 103. In some embodiments, the molding 106 is ground by grinding, planarization, chemical mechanical polish (CMP) or any other suitable operations. In some embodiments, the molding 106 includes various materials, such as molding compound, molding underfill, epoxy, resin, or the like. In some embodiments, the molding 106 has configuration similar to the one described above or illustrated in FIG. 1, 3, 5 or 6.

Figure 7D:
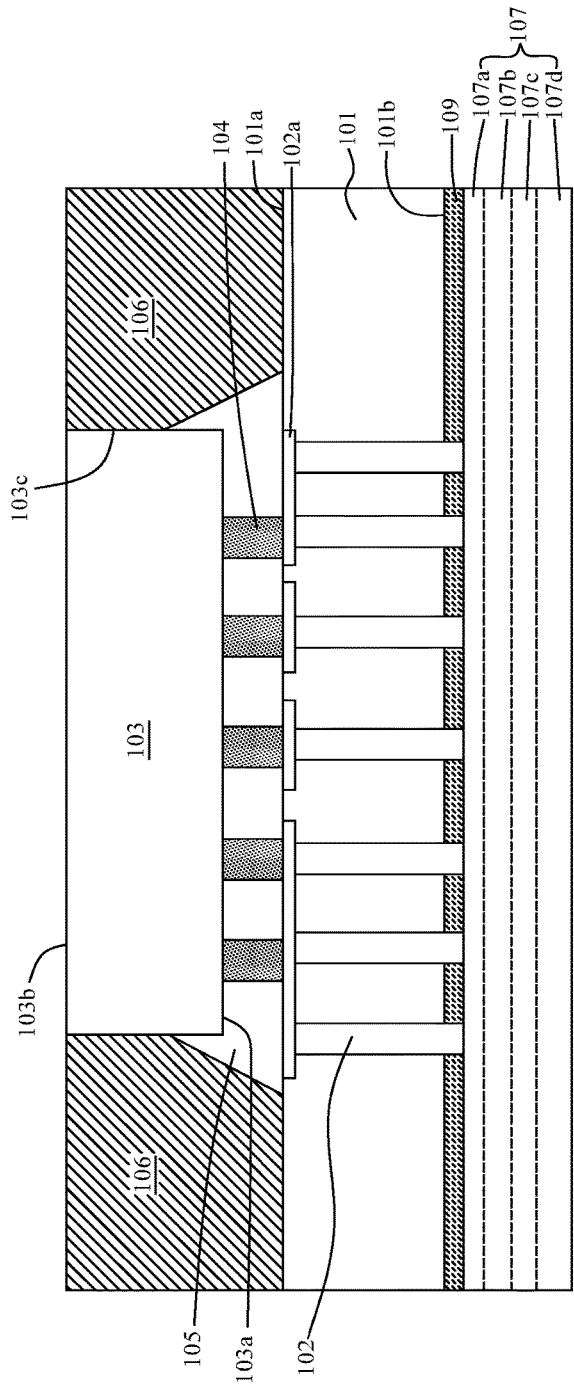

In operation 503, a dielectric layer 107 is disposed over the first substrate 101 as shown in FIG. 7D. In some embodiments, the dielectric layer 107 is disposed over the second surface 101b of the first substrate 101. In some embodiments, the dielectric layer 107 is disposed over the barrier layer 109. In some embodiments, the barrier layer 109 is disposed between the first substrate 101 and the dielectric layer 107. In some embodiments, the dielectric layer 107 is deposited by spin coating, chemical vapor deposition (CVD), plasma-enhanced CVD (PECVD), high-density plasma CVD (HDPCVD) or any other suitable operations. In some embodiments, the dielectric layer 107 includes polyimide (PI), polybenzoxazole (PBO) or the like. In some embodiments, the dielectric layer 107 is cured at a predetermined temperature. In some embodiments, the predetermined temperature is substantially lower than about 400'C. In some embodiments, the predetermined temperature is about 200'C to 300° C. In some embodiments, the predetermined temperature is about 250° C. In some embodiments, the predetermined temperature is substantially greater than about 400° C.

In some embodiments, the dielectric layer 107 includes several layers (107a, 107b, 107c, 107d) stacking over each other. In some embodiments, a second layer 107b of the dielectric layer 107 is disposed over a first layer 107a of the dielectric layer 107, and a third layer of the dielectric layer 107 is disposed over the second layer 107b, and a fourth layer 107d of the dielectric layer 107 is disposed over the third layer 107c. In some embodiments, each layer (107a, 107b, 107c, 107d) of the dielectric layer 107 includes dielectric material different from or same as each other. In some embodiments, the dielectric layer 107 has configuration similar to the one described above or illustrated in FIG. 1, 3, 5 or 6.

Figure 7E:
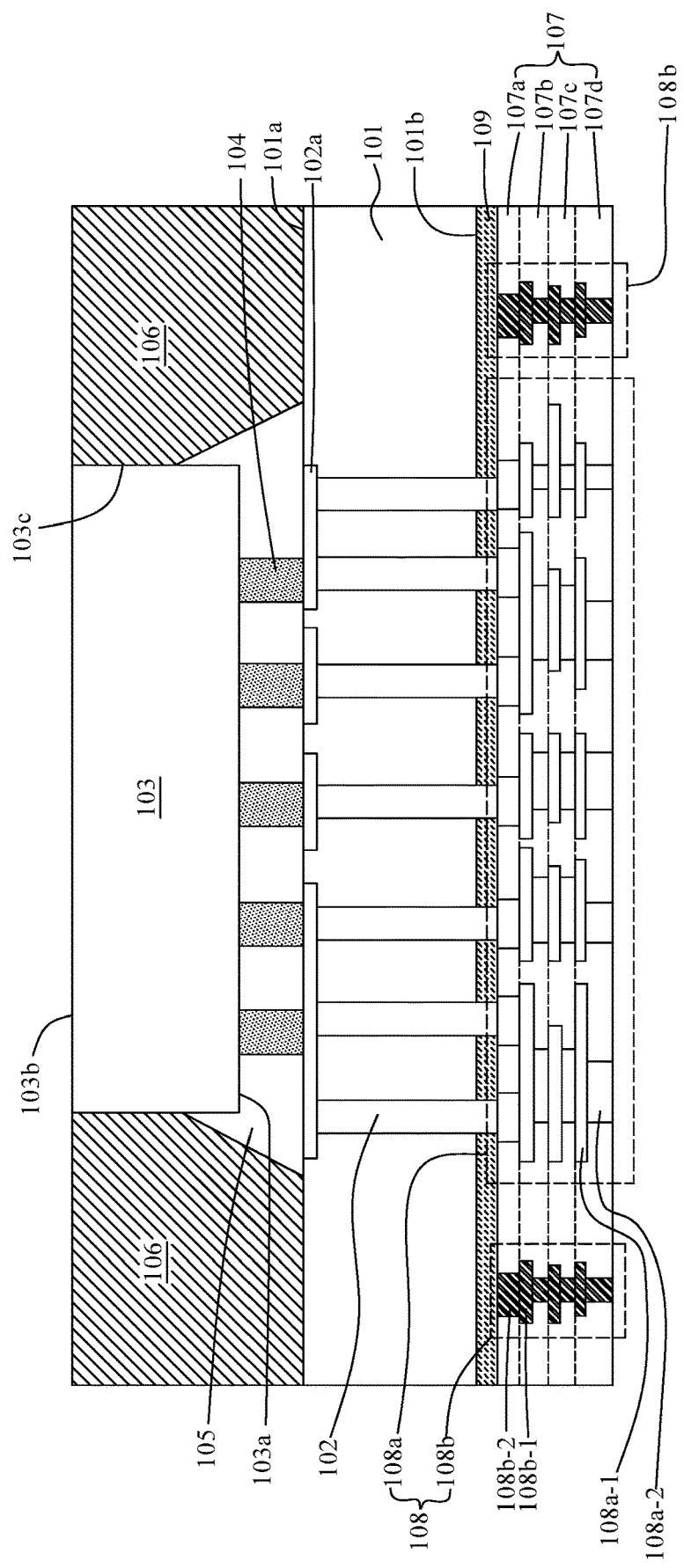
Figure 7F:
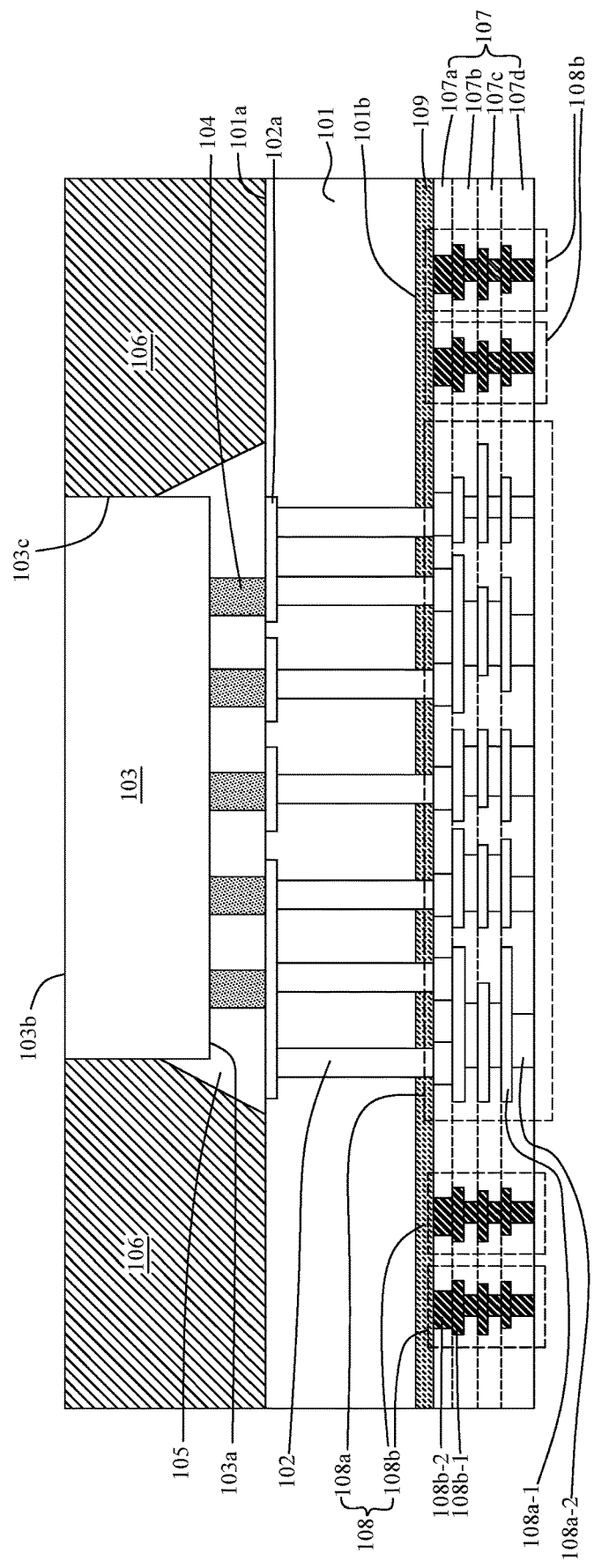

In operation 504, a first conductive structure 108a and a second conductive structure 108b are formed within the dielectric layer 107 as shown in FIG. 7E or 7F. In some embodiments, the first conductive structure 108a and the second conductive structure 108b are formed by removing a portion of the dielectric layer 107 to form an opening and then disposing a conductive material into the opening. In some embodiments, the removal of the portion of the dielectric layer 107 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the first conductive structure 108a and the second conductive structure 108b are formed simultaneously or separately. In some embodiments, the first conductive structure 108a and the second conductive structure 108b have configurations similar to those described above or illustrated in FIG. 1, 3, 5 or 6.

In some embodiments, the first conductive structure 108a is formed over and electrically connected to the via 102. In some embodiments, the first conductive structure 108a is electrically connected to the die 103 through the first conductive bump 104 and the via 102. In some embodiments, the first conductive structure 108a is formed at a central portion of the dielectric layer 107. In some embodiments, the first conductive structure 108a is extended through at least one layer of the dielectric layer 107.

In some embodiments, the first conductive structure 108a includes a first land portion 108a-1 and a first via portion 108a-2 coupled with the first land portion 108a-1. In some embodiments, the first conductive structure 108a is formed by disposing the first layer 107a of the dielectric layer 107, removing a portion of the first layer 107a to form an opening, disposing a conductive material into the opening to form the first land portion 108a-1 or the first via portion 108a-2, disposing the second layer 107b of the dielectric layer 107, removing a portion of the second layer 107b to form an opening and disposing a conductive material into the opening to form the first land portion 108a-1 or the first via portion 108a-2. In some embodiments, the first land portion 108a-1 and the first via portion 108a-2 are stacked over each other. In some embodiments, the first land portion 108a-1 and the first via portion 108a-2 are stacked alternately.

In some embodiments, the second conductive structure 108b is formed over the barrier layer 109. In some embodiments, the second conductive structure 108b is electrically isolated from the via 102. In some embodiments, the second conductive structure 108b is electrically isolated from the first conductive structure 108a. In some embodiments, the second conductive structure 108b is disposed away from the first conductive structure 108a. In some embodiments, the second conductive structure 108b is formed adjacent to an edge of the dielectric layer 107. In some embodiments, the second conductive structure 108b is extended through at least one layer of the dielectric layer 107.

In some embodiments, the second conductive structure 108b includes a second land portion 108b-1 and a second via portion 108b-2 coupled with the second land portion 108b-1. In some embodiments, the second conductive structure 108b is formed by disposing the first layer 107a of the dielectric layer 107, removing a portion of the first layer 107a to form an opening, disposing a conductive material into the opening to form the second land portion 108b-1 or the second via portion 108b-2, disposing the second layer 107b of the dielectric layer 107, removing a portion of the second layer 107b to form an opening and disposing a conductive material into the opening to form the second land portion 108b-1 or the second via portion 108b-2. In some embodiments, the second land portion 108b-1 and the second via portion 108b-2 are stacked over each other. In some embodiments, the second land portion 108b-1 and the second via portion 108b-2 are stacked alternately.

In some embodiments, two second conductive structures 108b are formed as shown in FIG. 7F. In some embodiments, two second conductive structures 108b are formed adjacent to the edge of the dielectric layer 107. In some embodiments, the two second conductive structures 108b are electrically isolated from the via 102 and the first conductive structure 108a. In some embodiments, two second conductive structures 108b are formed simultaneously or separately.

Figure 7G:
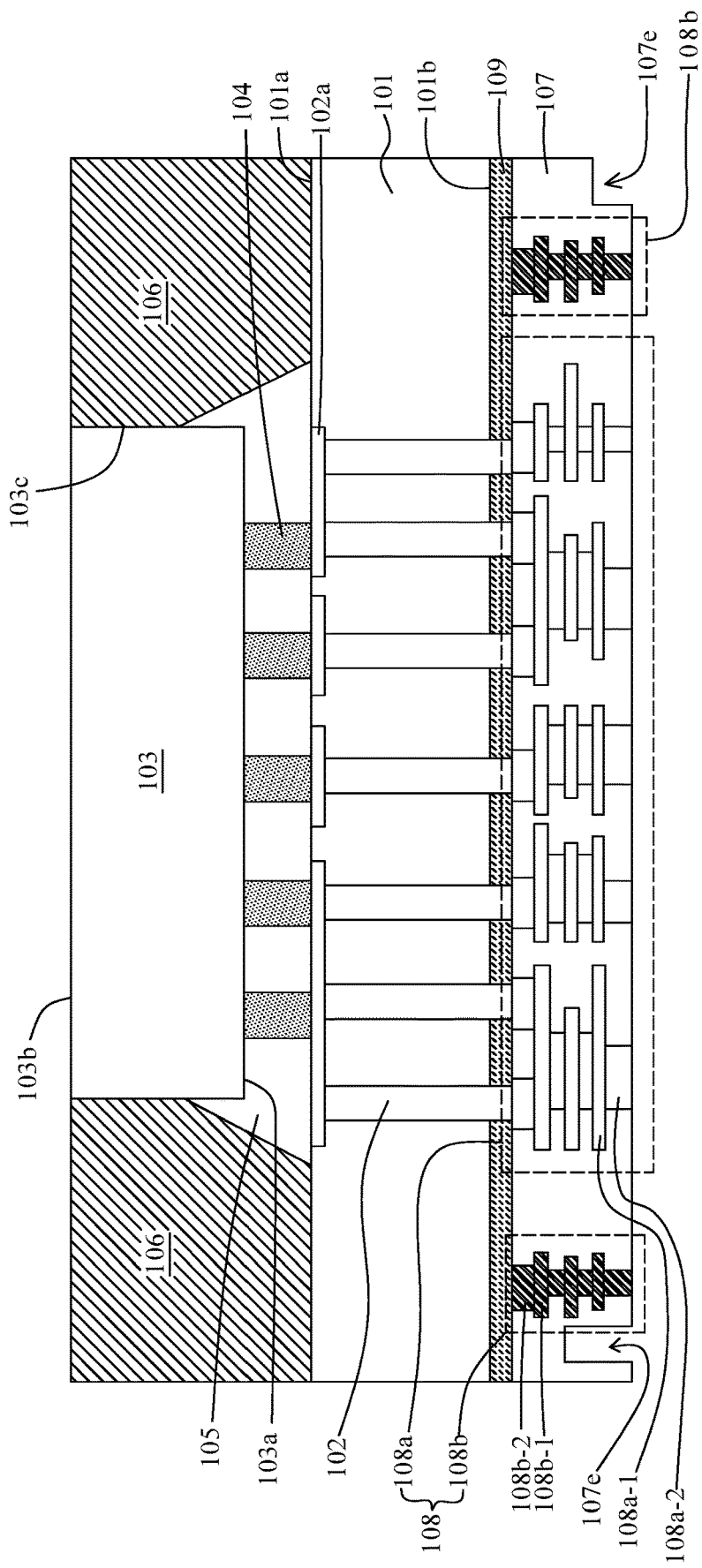

In some embodiments, a recess 107e is formed over the dielectric layer 107 as shown in FIG. 7G. In some embodiments, the recess 107e is indented into the dielectric layer 107 towards the first substrate 101. In some embodiments, the recess 107e is configured to prevent chippings from damaging the dielectric layer 107 or the semiconductor structure 300 or prevent cracks propagating into the dielectric layer 107 or the semiconductor structure 300 upon fabrication or singulation operations. In some embodiments, the recess 107e is disposed adjacent to the second conductive structure 108b. In some embodiments, a portion of the dielectric layer 107 is removed to form the recess 107e. In some embodiments, the recess 107e is formed by etching or any other suitable operations. In some embodiments, the recess 107e has configuration similar to the one described above or illustrated in FIG. 1, 3, 5 or 6.

Figure 7H:
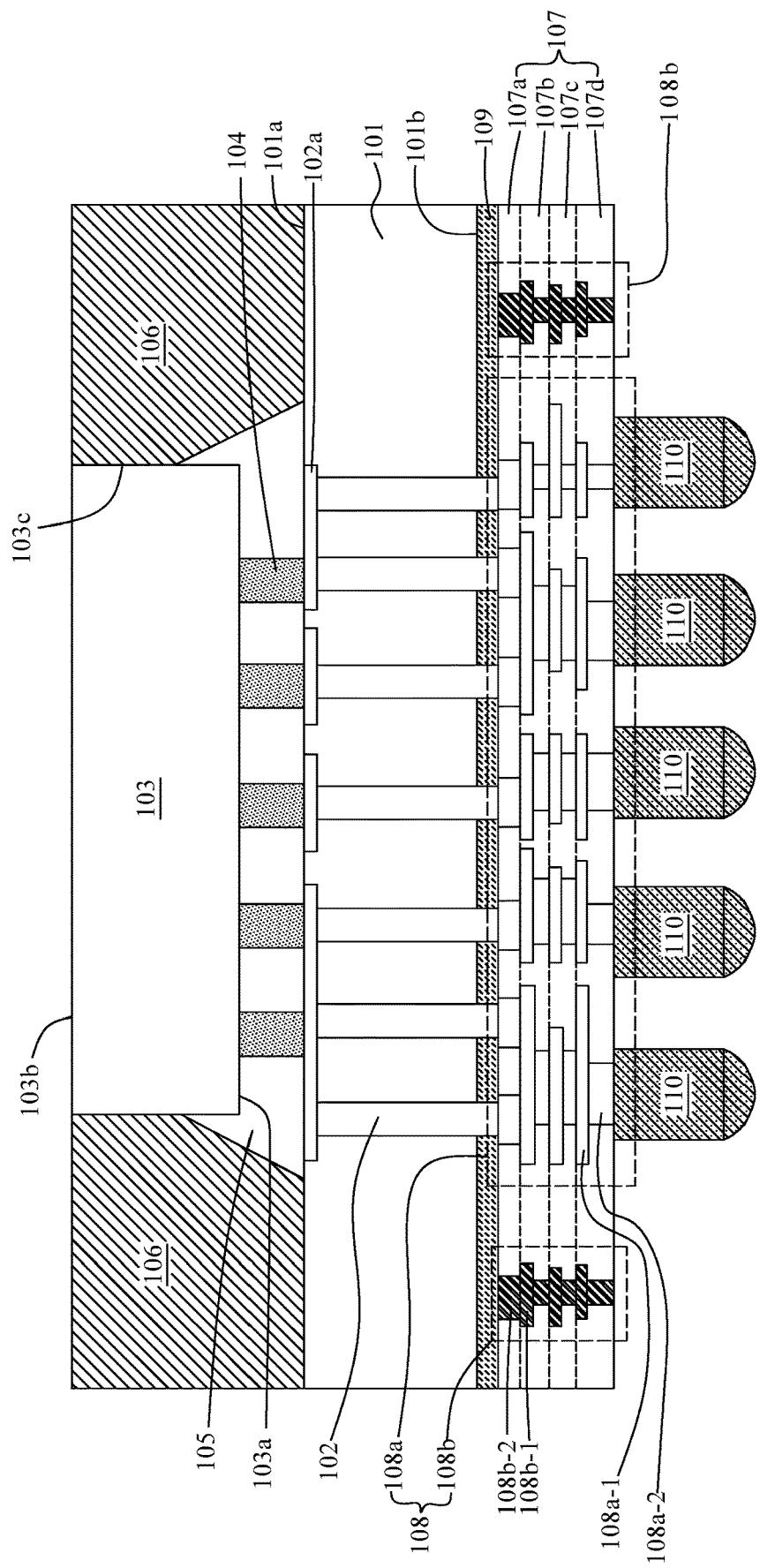

In operation 505, a second conductive bump 110 is disposed over the first conductive structure 108a as shown in FIG. 7H. In some embodiments, the second conductive bump 110 is electrically connected to the first conductive structure 108a but electrically isolated from the second conductive structure 108b. In some embodiments, the second conductive bump 110 is disposed by ball dropping, solder pasting, stencil printing or any other suitable operations. In some embodiments, the second conductive bump 110 is a solder joint, a solder bump, a solder ball, a ball grid array (BGA) ball, a controlled collapse chip connection (C4) bump, microbump or the like. In some embodiments, the second conductive bump 110 is a conductive pillar or post. In some embodiments, the second conductive bump 110 has configuration similar to the one described above or illustrated in FIG. 1, 3, 5 or 6.

Figure 7I:
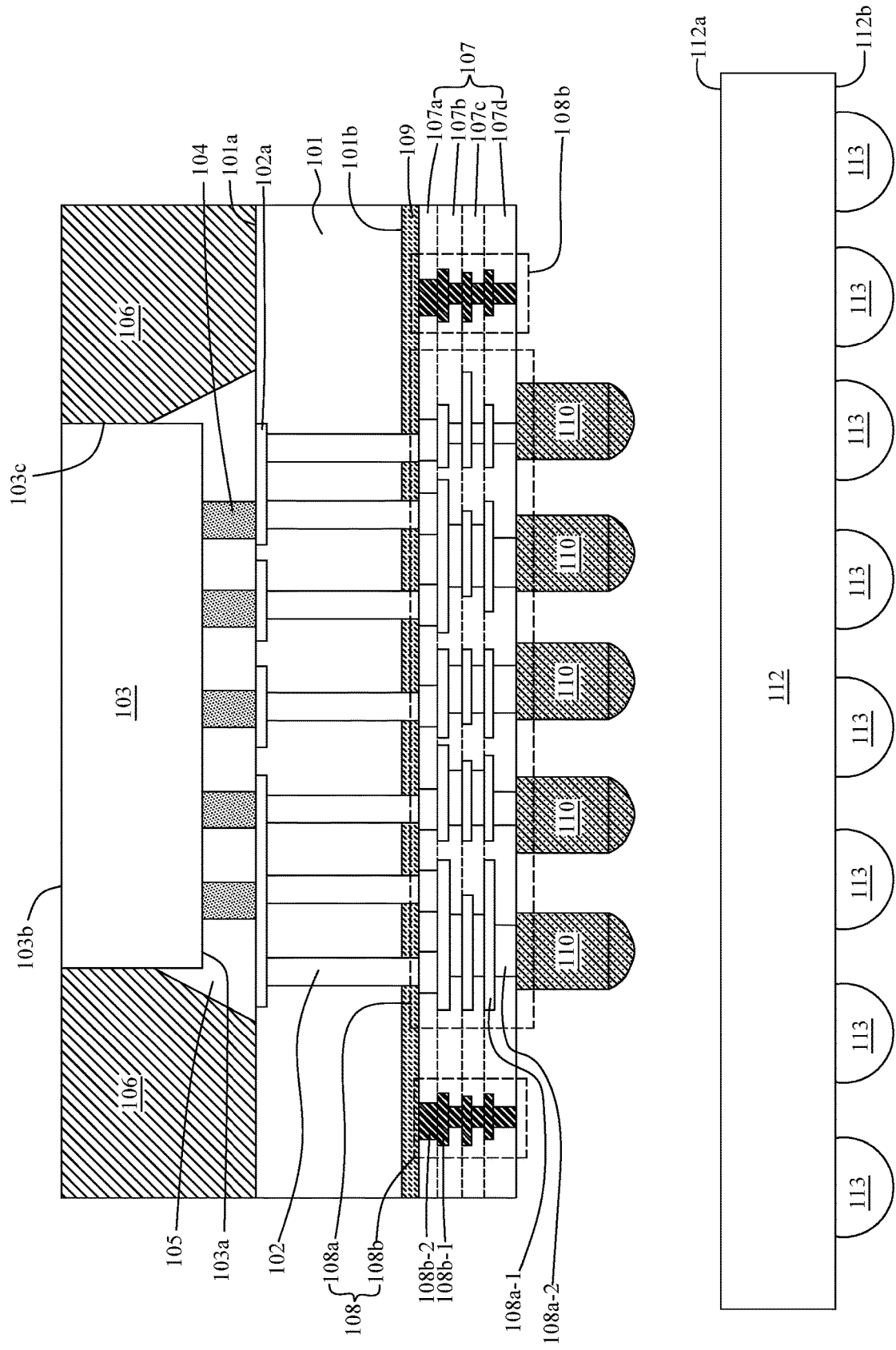

In operation 506, a second substrate 112 is provided or received as shown in FIG. 7I. In some embodiments, the second substrate 112 is a silicon substrate. In some embodiments, the second substrate 112 is a printed circuit board (PCB). In some embodiments, the second substrate 112 includes a third surface 112a and a fourth surface 112b opposite to the third surface 112a. In some embodiments, a connector 113 is disposed over the fourth surface 112b of the second substrate 112. In some embodiments, the connector 113 is configured to bond over another substrate or package and to electrically connect a circuitry of the second substrate 112 with a circuitry of another substrate or package. In some embodiments, the connector 113 is a solder joint, a solder bump, a solder ball, a ball grid army (BGA) ball, a controlled collapse chip connection (C4) bump, microbump, a conductive pillar, post or the like. In some embodiments, the second substrate 112 and the connector 113 have configurations similar to those described above or illustrated in FIG. 1, 3, 5 or 6.

Figure 7J:
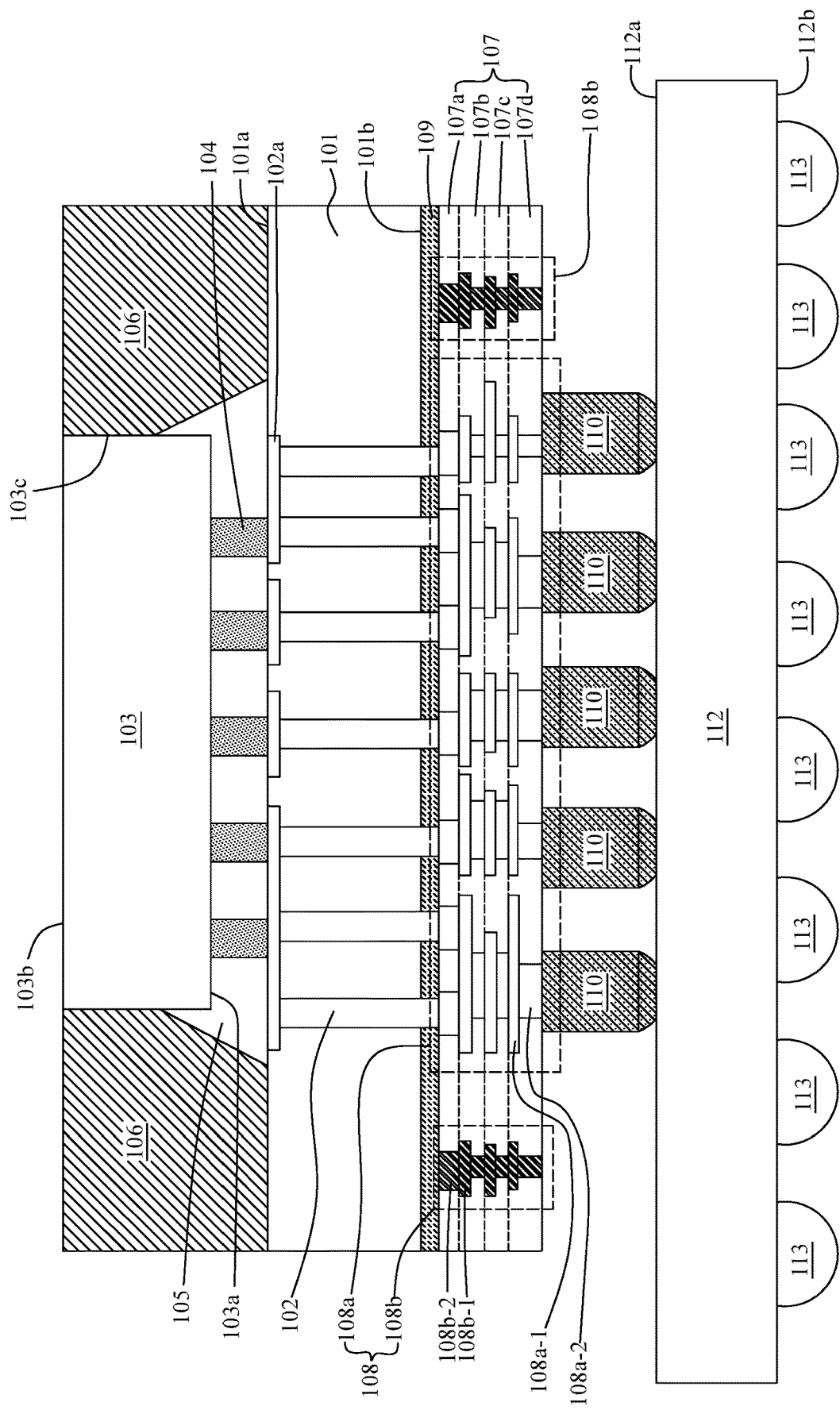
Figure 7K:
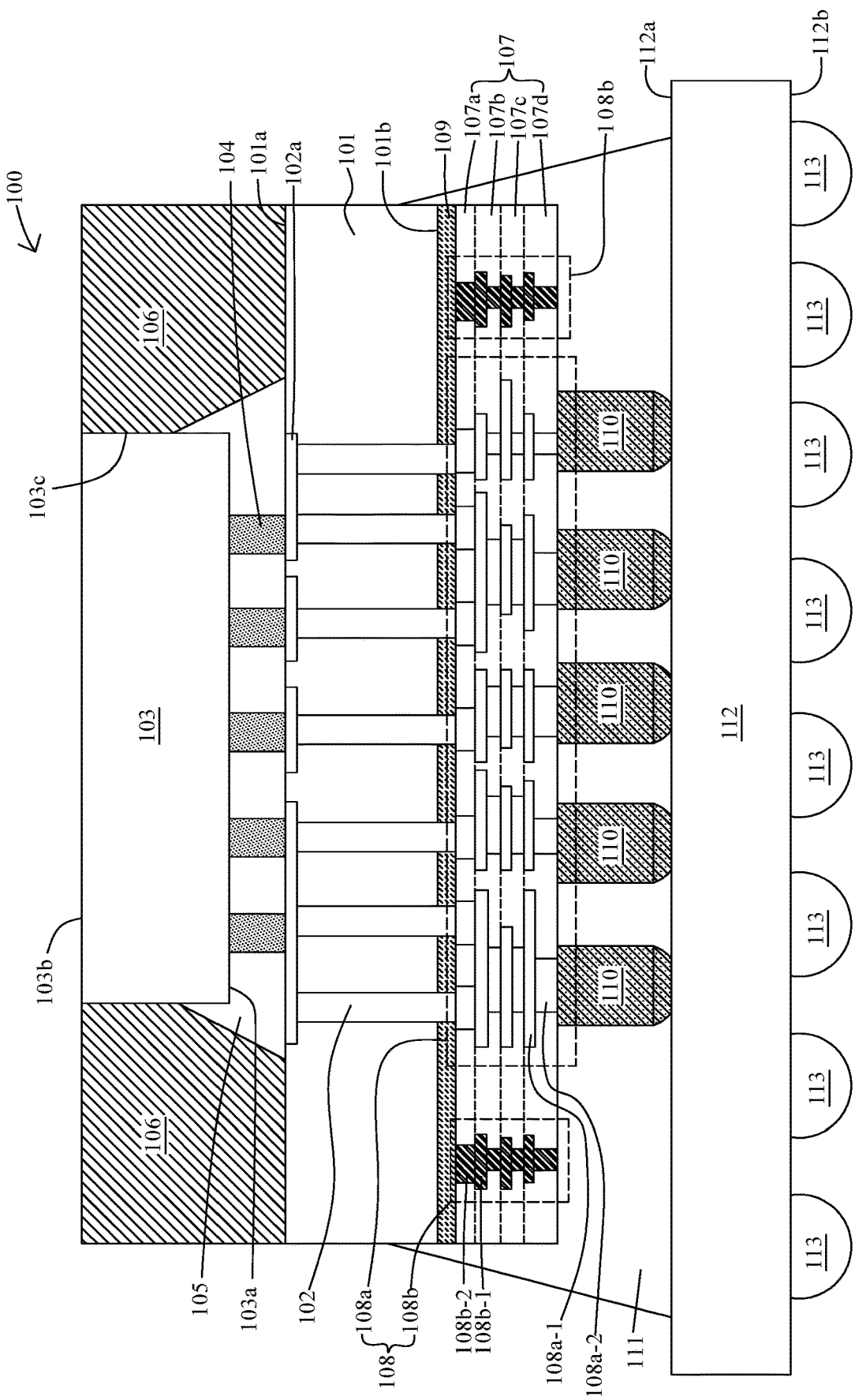

In operation 507, the second conductive bump 110 is bonded over the second substrate 112 as shown in FIG. 7J. In some embodiments, the first conductive structure 108a is bonded with the second substrate 112 by the second conductive bump 110. In some embodiments, a circuitry of the second substrate 112 is electrically connected to the die 103 through the second conductive bump 110, the first conductive structure 108a, the via 102 and the first conductive bump 104. In some embodiments, the second conductive bump 110 is reflowed after bonding over the second substrate 112.

In some embodiments, a second underfill material 111 is disposed over the second substrate 112 and surrounds the first substrate 101, the RDL (107, 108) and the second conductive bump 110. In some embodiments, the second underfill material 111 is disposed over the third surface 112a of the second substrate 112. In some embodiments, the second underfill material 111 encapsulates the second conductive bump 110. In some embodiments, the second underfill material 111 fills gap between adjacent second conductive bumps 110. In some embodiments, the second underfill material 111 is disposed by flowing, injection or any other suitable operations. In some embodiments, the second underfill material 111 includes epoxy, resin, epoxy molding compounds or etc. In some embodiments, the second underfill material 111 has configuration similar to the one described above or illustrated in FIG. 1, 3, 5 or 6. In some embodiments, a semiconductor structure 100 as illustrated in FIG. 1 is formed.

In the present disclosure, a semiconductor structure is disclosed. The semiconductor structure includes a substrate, a die disposed over a first surface of the substrate, a RDL disposed over a second surface of the substrate, a conductive structure disposed within the RDL. The conductive structure is configured as a seal ring protecting the RDL and the substrate from damages caused by cracks, chippings or other contaminants during fabrication or singulation. As such, delamination of components or damages on the semiconductor structure during fabrication or singulation can be minimized or prevented.

Some embodiments of the present disclosure provide a semiconductor structure. The semiconductor structure includes a first substrate; a second substrate, disposed over the first substrate; a die, disposed over the second substrate; a via, extending through the second substrate and electrically connecting to the die; a redistribution layer (RDL) disposed between the first substrate and the second substrate, including a dielectric layer, a first conductive structure electrically connecting to the via, and a second conductive structure laterally surrounding the first conductive structure; and an underfill material, partially surrounding the RDL, wherein one end of the second conductive structure exposed through the dielectric layer is entirely in contact with the underfill material.

Some embodiments of the present disclosure provide a semiconductor structure. The semiconductor structure includes a first substrate; a redistribution layer (RDL), disposed over the first substrate, and including a dielectric layer, a first conductive structure disposed in the dielectric layer, and a second conductive structure laterally surrounding the first conductive structure; a plurality of conductive bumps, disposed between and electrically connecting the first substrate and the first conductive structure, wherein the plurality of conductive bumps are electrically isolated from the second conductive structure; a second substrate, disposed over the RDL; a via, extending through the second substrate, and electrically connecting to the first conductive structure; and a die, disposed over the second substrate, and electrically connecting to the via.

Some embodiments of the present disclosure provide a semiconductor structure. The semiconductor structure includes a die; a first substrate, disposed over the die; a redistribution layer (RDL), disposed over the first substrate, and comprising a dielectric layer, a first conductive structure disposed in the dielectric layer, and a second conductive structure disposed adjacent to the first conductive feature in the dielectric layer; a second substrate, disposed over the RDL; and a plurality of conductive bumps, disposed between the RDL and the second substrate, electrically connecting to the first conductive structure, and electrically isolated from the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a first substrate;
   a second substrate, disposed over the first substrate;
   a die, disposed over the second substrate;
   a via, extending through the second substrate and electrically connecting to the die;
   a redistribution layer (RDL) disposed between the first substrate and the second substrate, including a dielectric layer, a first conductive structure electrically connecting to the via, and a second conductive structure laterally surrounding the first conductive structure; and
   an underfill material, partially surrounding the RDL, wherein one end of the second conductive structure exposed through the dielectric layer is entirely in contact with the underfill material.

2. The semiconductor structure of claim 1, wherein the second conductive structure is disposed adjacent to the first conductive structure or an edge of the RDL.

3. The semiconductor structure of claim 1, wherein a distance between the first conductive structure and an edge of the dielectric layer is greater than a distance between the second conductive structure and the edge of the dielectric layer.

4. The semiconductor structure of claim 1, further comprising:
   a barrier layer, disposed between the second substrate and the RDL.

5. The semiconductor structure of claim 4, wherein the barrier layer surrounds a portion of the via.

6. The semiconductor structure of claim 4, wherein the second conductive structure is in contact with the barrier layer.

7. The semiconductor structure of claim 1, further comprising:
   a device, disposed over the first substrate, wherein the device is disposed adjacent to the underfill material.

8. A semiconductor structure, comprising:
   a first substrate;
   a redistribution layer (RDL), disposed over the first substrate, and including a dielectric layer, a first conductive structure disposed in the dielectric layer, and a second conductive structure laterally surrounding the first conductive structure;
   a plurality of conductive bumps, disposed between and electrically connecting the first substrate and the first conductive structure, wherein the plurality of conductive bumps are electrically isolated from the second conductive structure;
   a second substrate, disposed over the RDL;
   a via, extending through the second substrate, and electrically connecting to the first conductive structure; and
   a die, disposed over the second substrate, and electrically connecting to the via.

9. The semiconductor structure of claim 8, wherein the second conductive structure is offset from the die along a direction parallel to a surface of the RDL facing the second substrate.

10. The semiconductor structure of claim 8, wherein the second conductive structure is offset from the via along a direction parallel to a surface of the RDL facing the second substrate.

11. The semiconductor structure of claim 8, wherein the second conductive structure is offset from the plurality of conductive bumps along a direction parallel to a surface of the RDL facing the first substrate.

12. The semiconductor structure of claim 8, wherein the RDL further comprises a third conductive structure disposed between the first conductive structure and the second conductive structure.

13. The semiconductor structure of claim 12, wherein the third conductive structure is electrically isolated from the second conductive structure.

14. The semiconductor structure of claim 12, wherein the third conductive structure encircles the first conductive structure, and the second conductive structure encircles the third conductive structure from a top view perspective.

15. A semiconductor structure, comprising:
   a die;
   a first substrate, disposed over the die;
   a redistribution layer (RDL), disposed over the first substrate, and comprising a dielectric layer, a first conductive structure disposed in the dielectric layer, and a second conductive structure disposed adjacent to the first conductive feature in the dielectric layer,
   a second substrate, disposed over the RDL; and
   a plurality of conductive bumps, disposed between the RDL and the second substrate, electrically connecting to the first conductive structure, and electrically isolated from the second conductive structure.

16. The semiconductor structure of claim 15, wherein the second conductive structure is electrically isolated from the die.

17. The semiconductor structure of claim 15, wherein the first conductive structure is electrically connected to the die.

18. The semiconductor structure of claim 15, further comprising:
   a first recess, disposed between the second conductive structure and a first edge of the dielectric layer.

19. The semiconductor structure of claim 18, further comprising:
   a second recess, disposed between the second conductive structure and a second edge of the dielectric layer, wherein the second edge is opposite to the first edge, and depths of the first recess and the second recess are different.

20. The semiconductor structure of claim 15, further comprising:
   a device, disposed over a surface of the second substrate facing the RDL.

* * * * *